United States Patent
Suzuki et al.

(10) Patent No.: US 8,537,604 B2
(45) Date of Patent: Sep. 17, 2013

(54) MAGNETORESISTANCE ELEMENT, MRAM, AND INITIALIZATION METHOD FOR MAGNETORESISTANCE ELEMENT

(75) Inventors: Tetsuhiro Suzuki, Tokyo (JP); Shunsuke Fukami, Tokyo (JP); Kiyokazu Nagahara, Tokyo (JP); Norikazu Ohshima, Tokyo (JP); Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 226 days.

(21) Appl. No.: 13/062,764

(22) PCT Filed: Oct. 16, 2009

(86) PCT No.: PCT/JP2009/067890
§ 371 (c)(1),
(2), (4) Date: Mar. 24, 2011

(87) PCT Pub. No.: WO2010/047276
PCT Pub. Date: Apr. 29, 2010

(65) Prior Publication Data
US 2011/0188298 A1    Aug. 4, 2011

(30) Foreign Application Priority Data
Oct. 20, 2008 (JP) .................. 2008-270002

(51) Int. Cl.
*G11C 11/00* (2006.01)
(52) U.S. Cl.
USPC ................. 365/158; 365/171; 365/173

(58) Field of Classification Search
USPC ............................. 365/158, 171, 173
See application file for complete search history.

(56) References Cited

U.S. PATENT DOCUMENTS

| 6,834,005 B1 | 12/2004 | Parkin |
| 2006/0171198 A1* | 8/2006 | Saito et al. ............. 365/158 |

FOREIGN PATENT DOCUMENTS

| JP | 2005093488 A | 4/2005 |
| JP | 2005150303 A | 6/2005 |
| JP | 2005191032 A | 7/2005 |
| JP | 2007324172 A | 12/2007 |
| WO | 2005069368 A | 7/2005 |
| WO | 2007119748 A | 10/2007 |

OTHER PUBLICATIONS

International Search Report for PCT/JP2009/067890 mailed Jan. 19, 2010.

* cited by examiner

*Primary Examiner* — Huan Hoang

(57) ABSTRACT

A magnetoresistance element is provided with: a magnetization recording layer that is a ferromagnetic layer. The magnetization recording layer includes: a magnetization reversal region having a reversible magnetization; a first magnetization fixed region connected to a first boundary of the magnetization reversal region and having a magnetization direction fixed in a first direction; and a second magnetization fixed region connected to a second boundary of the magnetization reversal region and having a magnetization direction fixed in a second direction. At least one magnetization reversal facilitation structure which is a structure in which a magnetization is reversed more easily than the remaining portion is provided for a portion of the second magnetization fixed region.

19 Claims, 21 Drawing Sheets

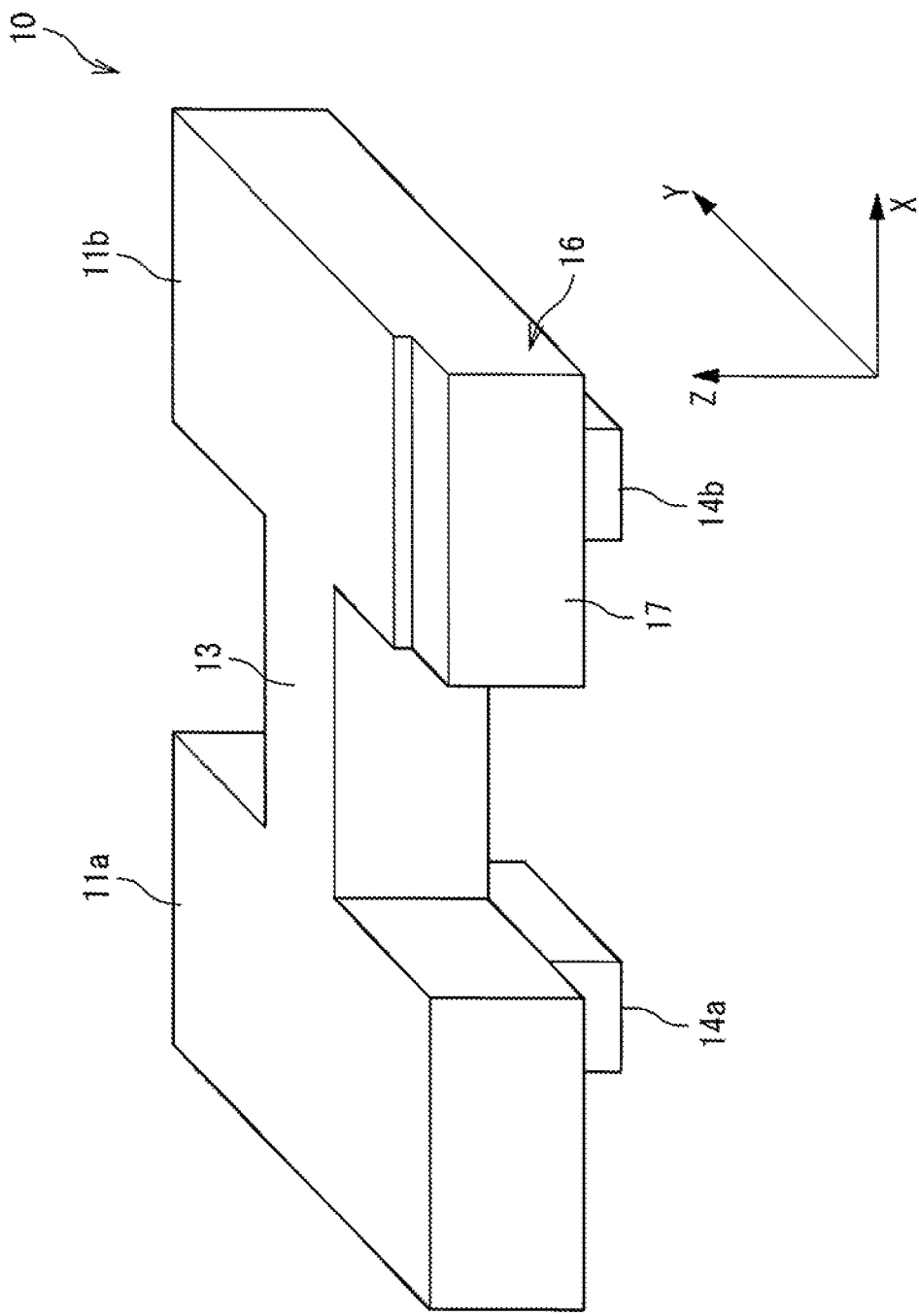

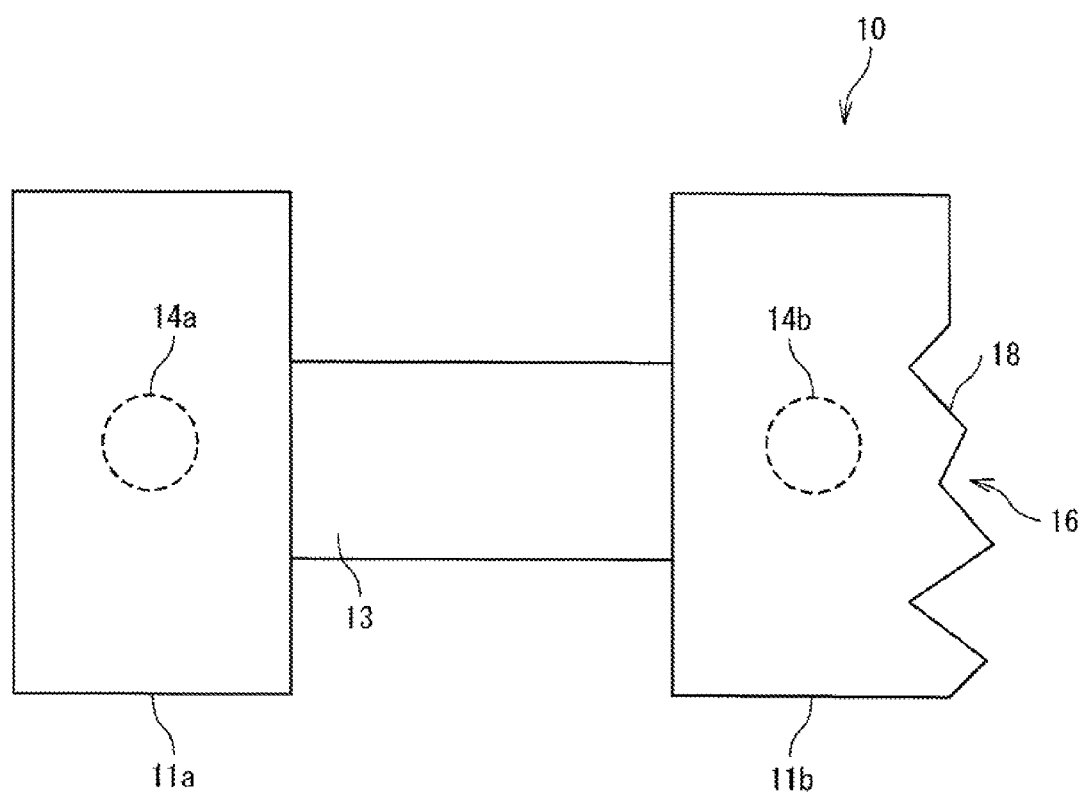

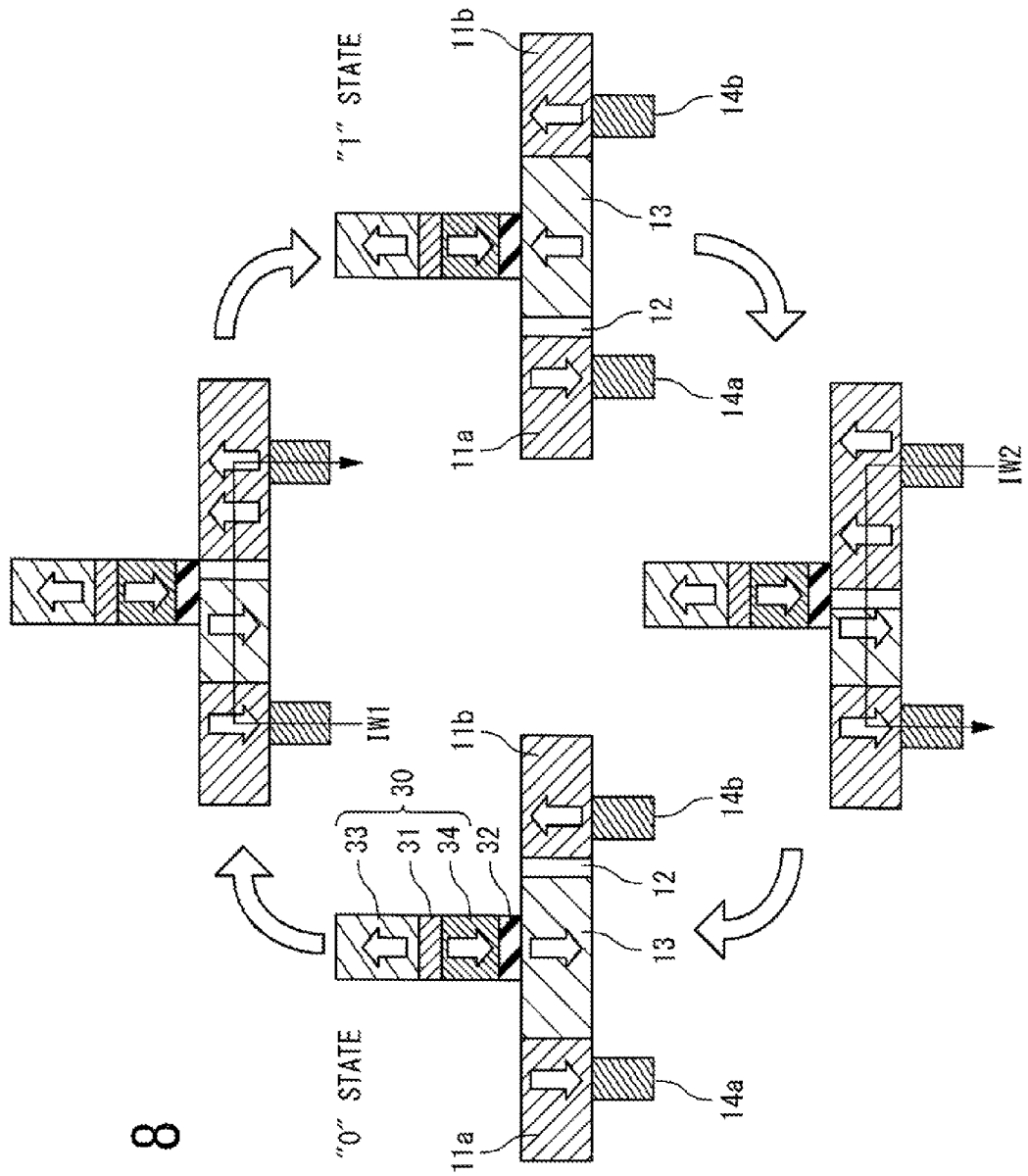

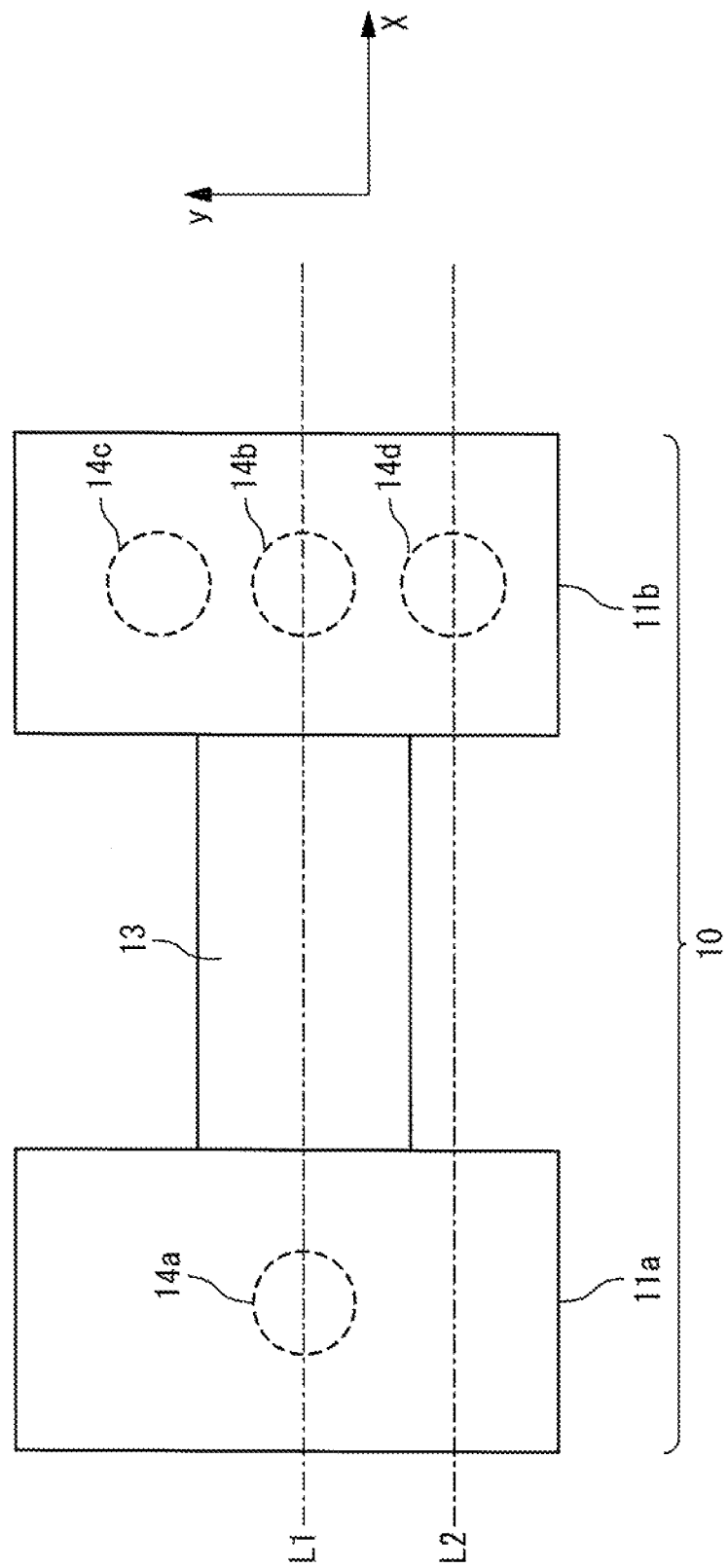

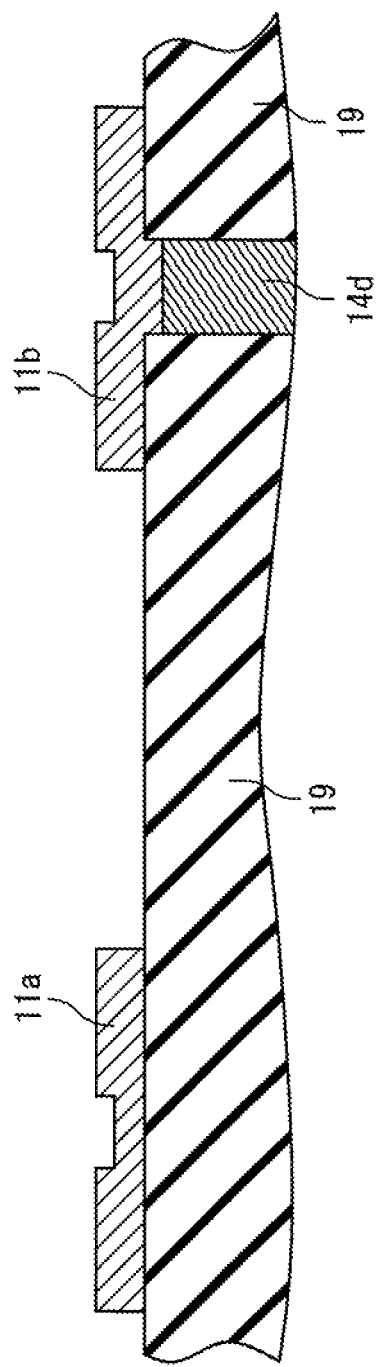

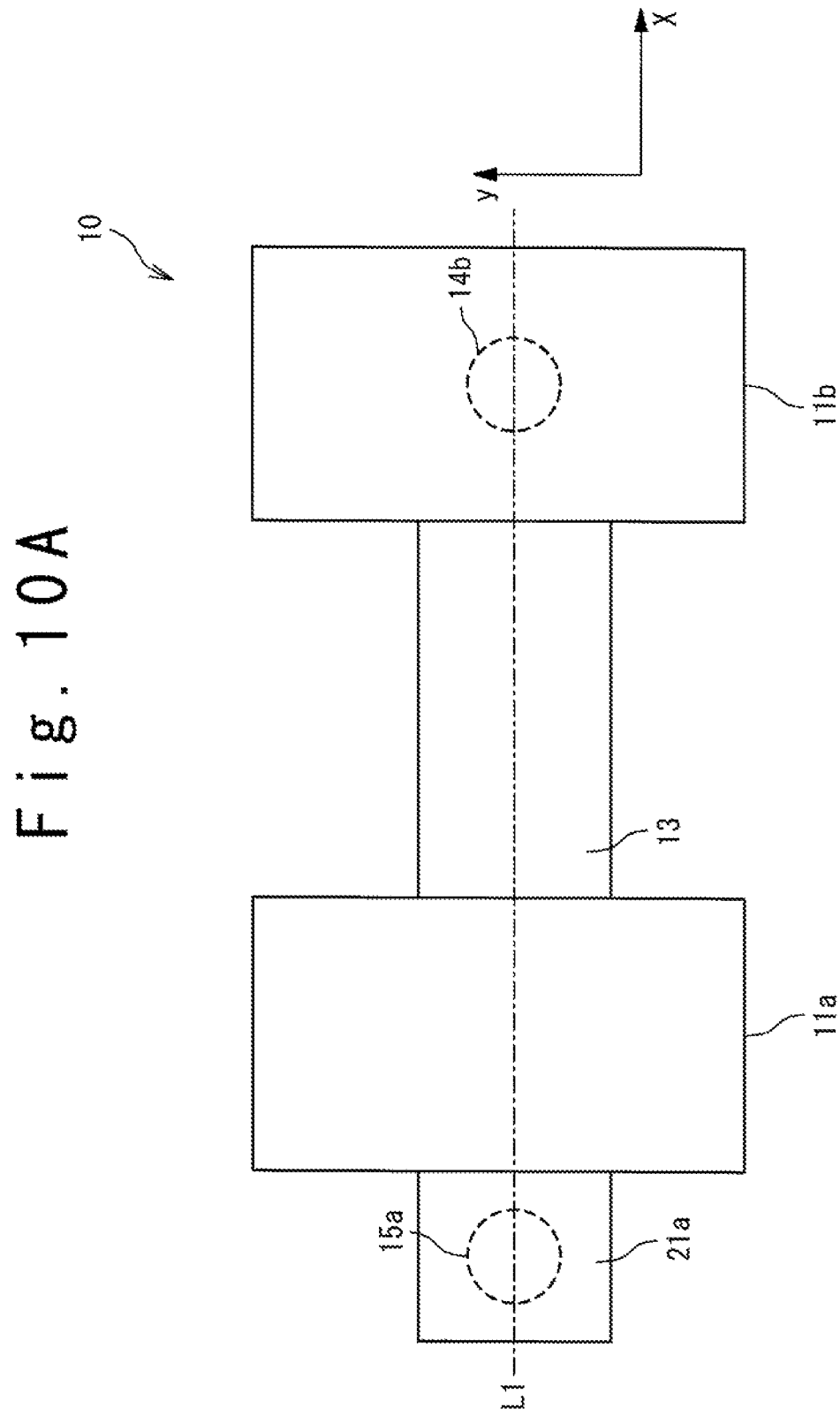

MAGNETORESISTANCE ELEMENT, MRAM, AND INITIALIZATION METHOD FOR MAGNETORESISTANCE ELEMENT

TECHNICAL FIELD

The present invention relates to a magnetoresistance element and an MRAM (magnetic random access memory) using the same for a memory cell, and more particularly, to a technique for initialization of a domain wall motion type magnetoresistance element.

BACKGROUND ART

An MRAM is a promising nonvolatile memory from the perspective of high integration and high speed operation. In an MRAM, magnetoresistance elements exhibiting a "magnetoresistance effect" such as a TMR (tunnel magnetoresistance) effect are used. In a magnetoresistance element, a magnetic tunnel junction (MTJ) is formed, in which a tunnel barrier layer is sandwiched by two ferromagnetic layers, for example. One of the two ferromagnetic layers is a magnetization fixed layer (or pinned layer) having a fixed magnetization direction, and the other is a magnetization free layer (free layer) having a reversible magnetization direction.

It is known that the resistance value $(R+\Delta R)$ of an MTJ for the case where the magnetization directions of the pinned and free layers are "antiparallel" to each other is larger than the resistance value (R) for the case where they are "parallel" to each other. The MRAM uses magnetoresistance elements each having an MTJ as memory cells, and stores data in a nonvolatile manner by using the variations in the resistance values. For example, the antiparallel state is associated with data "1", whereas the parallel state is associated with to data "0". Data write onto a memory cell is performed by reversing the magnetization direction of the magnetization free layer.

One of the most traditional methods for writing data onto an MRAM is to reverse the magnetization of a magnetization free layer by a current magnetic field. In this writing method, however, the reversal magnetic field necessary to reverse the magnetization of the magnetization free layer increases in almost inverse proportion to the memory cell size. That is, the write current increases as the size of the memory cell is miniaturized. This is not preferable in terms of providing a highly integrated MRAM.

As a writing method that suppresses the increase in the write current caused by the miniaturization, a "spin transfer method" is proposed (See Japanese Patent Application Publication No. P2005-93488A (Patent literature 1), for example). In the spin transfer method, a spin-polarized current is injected into a ferromagnetic conductor, and the magnetization is reversed by the direct interaction between spins of conduction electrons of the current and the magnetic moment of the conductor. This phenomenon is referred to as spin transfer magnetization switching. The write operation based on the spin transfer method is appropriate to realize a highly integrated MRAM because the write current decreases as the size of the magnetization free layer is decreased.

U.S. Pat. No. 6,834,005 (Patent literature 2) discloses a magnetic shift register using spin transfer. This shift register utilizes a domain wall in magnetic material to store information. In a magnetic material divided into a number of regions (magnetic domains) by constrictions and the like, a current is injected through the domain walls, and the domain walls are moved by the current. The direction of magnetization in each of the regions is treated as record data. Such a magnetic shift register is used to record large amounts of serial data, for example.

Domain wall motion type MRAMs using such domain wall motion by spin transfer are disclosed in Japanese Patent Application Publication No. P2005-191032A and International Application No. WO2005/069368 (Patent literatures 3 and 4).

The MRAM disclosed in Japanese Patent Application Publication No. P2005-191032A is provided with: a magnetization fixed layer having a fixed magnetization; a tunnel dielectric layer laminated on the magnetization fixed layer; and a magnetization recording layer laminated on the tunnel dielectric layer. Since the magnetization recording layer includes both of a portion having a reversible magnetization direction and a portion having a magnetization direction which is not substantially changed, the magnetization recording layer is referred to as so, instead of the magnetization free layer. FIG. 1 illustrates the structure of the magnetization recording layer. In FIG. 1, the magnetization recording layer 100 has a linear shape. Specifically, the magnetization recording layer 100 includes: a junction portion 103 overlapping the tunnel dielectric layer and the magnetization fixed layer; constriction portions 104 adjacent to both ends of the junction portion 103; and a pair of magnetization fixed portions 101 and 102 respectively formed adjacent to the constriction portions 104. The pair of magnetization fixed portions 101 and 102 are provided with fixed magnetizations respectively having opposite directions to each other. Each of the magnetizations of these magnetization fixed portions is fixed by, for example, an exchange bias magnetic field formed by laminating an antiferromagnetic layer thereon. Further, the MRAM is provided with a pair of writing terminals 105 and 106 electrically connected to the pair of magnetization fixed portions 101 and 102. Through the writing terminals 105 and 106, a write current flows through the junction portion 103, the pair of constriction portions 104, and the pair of magnetization fixed portions 101 and 102 of the magnetization recording layer 100. The constriction portion 104 functions as a pinning potential for the domain wall, and information is retained depending on whether the domain wall is present in the left or right constriction portion, or depending on the magnetization direction of the junction portion 103. The direction of domain wall motion is controlled by the direction of the write current.

In the MRAM disclosed in WO2005/069368, a step is used as means to form the pinning potential. FIG. 2 illustrates the structure of the magnetization recording layer in the MRAM. In FIG. 2, the magnetization recording layer 100 includes three regions respectively having different thicknesses. Specifically, the magnetization recording layer 100 includes a thickest first magnetization fixed portion 101, a second thickest second magnetization fixed portion 102, and a thinnest junction portion 103 arranged between them. In FIG. 2, step structures provided at boundaries between the junction portion 103 and the magnetization fixed portions 101 and 102 function as the pinning potentials. This allows a domain wall 112 to move between the two step structures by applying a current. It should be noted that, in International Application No. WO2005/069368, magnetic semiconductor having anisotropy perpendicular to the film surface thereof is used as the magnetization recording layer, and the current necessary for the domain wall motion is as small as 0.35 mA. In practice, a tunnel dielectric layer and a magnetization fixed layer are arranged over the junction portion 103, but not illustrated in FIG. 2.

In a domain wall motion type MRAM, the magnetization directions of the two magnetization fixed portions of the magnetization recording layer should be directed in antiparallel to each other. In the following, the step of directing the magnetizations of the two magnetization fixed portions in the directions antiparallel to each other by, for example, applying an external magnetic field having an appropriate magnitude is referred to as "initialization". Patent literature 3 does not refer to a method for directing the magnetizations of the two magnetization fixed portions in the directions antiparallel to each other.

International Application No. WO2005/069368 discloses that the initialization by an external magnetic field after deposition is achieved by making use of the difference in the coercive force between the first magnetization fixed portion 101 and the second magnetization fixed portion 102. Specifically, WO2005/069368 discloses that, the difference in coercive force is provided by making the thicknesses of the first magnetization fixed portion 101 and the second magnetization fixed portion 102 different from each other. Since the magnetization is unlikely to be reversed as the thickness of the magnetic layer is increased, a domain wall can be introduced at the boundary between the first magnetization fixed portion 101 and the junction portion 103 by applying a magnetic field that reverses the magnetizations of the second magnetization fixed portion 102 and junction portion 103 but does not reverse the magnetization of the first magnetization fixed portion 101.

CITATION LIST

Patent Literature

Patent literature 1: Japanese Patent Application Publication No. P2005-93488A
Patent literature 2: U.S. Pat. No. 6,834,005
Patent literature 3: Japanese Patent Application Publication No. P2005-191032A
Patent literature 4: International Application No. WO2005/069368

DISCLOSURE OF INVENTION

The formation of the structure in which the thicknesses of the first magnetization fixed portion 101 and the second magnetization fixed portion 102 are different from each other as in the case of WO2005/069368, however, the number of processes is increased, which causes an increase in cost. That is, in order to make the thicknesses of the first magnetization fixed portion 101 and the second magnetization fixed portion 102 different from each other, the two steps respectively having different heights should be formed. In order to form the two types of different steps, exposure processes should be repeated twice. This implies the number of processes is increased.

Further, in International Application No. WO2005/069368, the magnetic layer of the junction portion 103 in which the domain wall moves in writing is damaged by etching in the step formation. Surface roughness caused by the etching damage may cause pinning of the domain wall, which cause a failure in which the domain wall does not stably move.

Therefore, an objective of the present invention is to provide an element structure which requires only a small number of processes and prevents a domain wall motion failure and a method for introducing a domain wall into the structure to perform initialization, with respect to a current-driven domain wall motion type magnetoresistance element.

In an aspect of the present invention, a magnetoresistance element is provided with: a magnetization recording layer that is a ferromagnetic layer. The magnetization recording layer includes: a magnetization reversal region having a reversible magnetization; a first magnetization fixed region connected to a first boundary of the magnetization reversal region and having a magnetization direction fixed in a first direction; and a second magnetization fixed region connected to a second boundary of the magnetization reversal region and having a magnetization direction fixed in a second direction. At least one magnetization reversal facilitation structure which is a structure in which a magnetization is reversed more easily than the remaining portion is provided for a portion of the second magnetization fixed region.

In another aspect of the present invention, an initialization method for the above-described magnetoresistance element is provided. The initialization method is provided with steps of: applying to the magnetization recording layer a first magnetic field that is larger than a magnetic field that depins a domain wall positioned at the first boundary into the first magnetization fixed region, and larger than a magnetic field that depins a domain wall positioned at the second boundary into the second magnetization fixed region; and applying in a direction opposite to a direction of the first magnetic field a second magnetic field that is larger than a magnetization reversal nucleation magnetic field, a propagation magnetic field, and a depinning magnetic field in the magnetization reversal facilitation structure, and a propagation magnetic field in the second magnetization fixed region.

The present invention provides an element structure that requires only a small number of processing steps and avoids a domain wall motion failure, and a method for introducing a domain wall into the structure to perform initialization, with respect to a current-driven domain wall motion type magnetoresistance element.

BRIEF DESCRIPTION OF DRAWINGS

FIG. 5 is a perspective view illustrating still another configuration of the magnetoresistance element of the first embodiment;

FIG. 6 is a plan view illustrating still another configuration of the magnetoresistance element of the first embodiment;

FIG. 8 is a cross-sectional view illustrating a procedure for data writing onto the magnetoresistance element of the first embodiment;

FIG. 9A is a plan view illustrating a configuration of a magnetoresistance element in a second embodiment of the present invention;

FIG. 9C is a cross-sectional view illustrating the configuration of the magnetoresistance element in FIG. 9A;

FIG. 10A is a plan view illustrating another configuration of the magnetoresistance element of the second embodiment;

EMBODIMENTS OF INVENTION

In the following, various embodiments of the present invention are described with reference to the accompanying drawings. The present invention may be applied to both of cases where a magnetization recording layer of a magnetoresistance element has magnetization in an in-plane direction and where a magnetization recording layer of a magnetoresistance element has magnetization in a perpendicular direction; however, in the following, a description is given of a case of using a magnetization recording layer having a magnetization in the perpendicular direction. In order to improve performance of the magnetoresistance element, it is preferable to use a magnetization recording layer having a magnetization in the perpendicular direction.

First Embodiment (Structure of Magnetoresistance Element)

Figure 1:
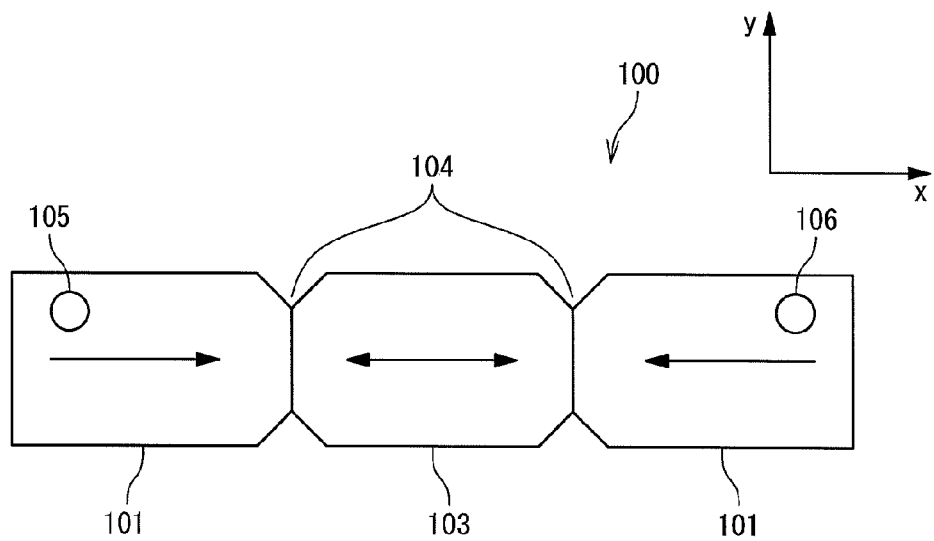
FIG. 1 is a plan view illustrating a configuration of a magnetization recording layer of a conventional magnetoresistance element.
Figure 2:
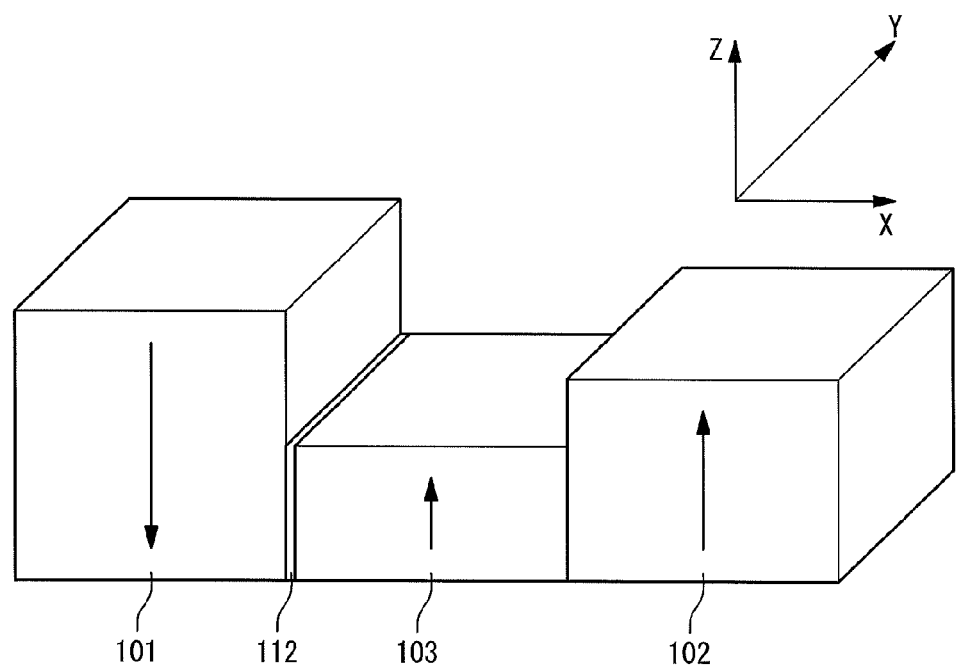
FIG. 2 is a perspective view illustrating another configuration of the magnetization recording layer of the conventional magnetoresistance element.
Figure 3A:
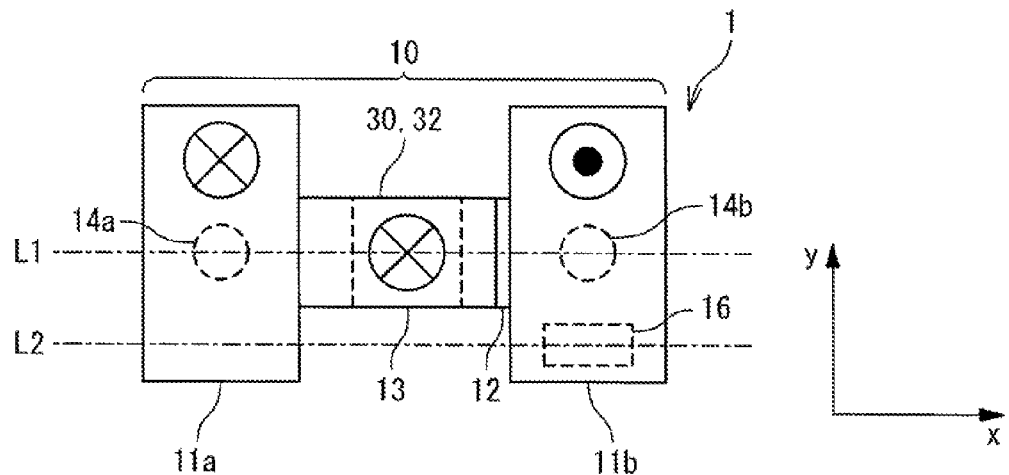
FIG. 3A is a plan view illustrating a configuration of a magnetoresistance element in a first embodiment of the present invention.
Figure 3B:
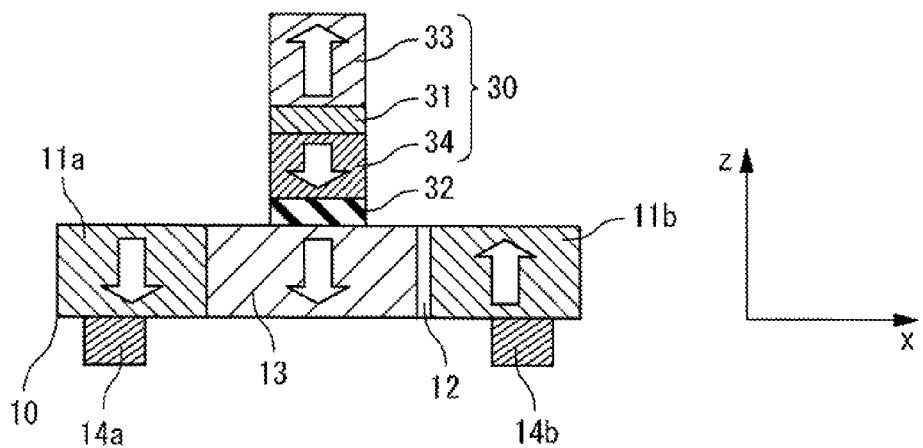
FIG. 3B is a cross-sectional view illustrating the configuration of the magnetoresistance element in FIG. 3A.
Figure 3C:
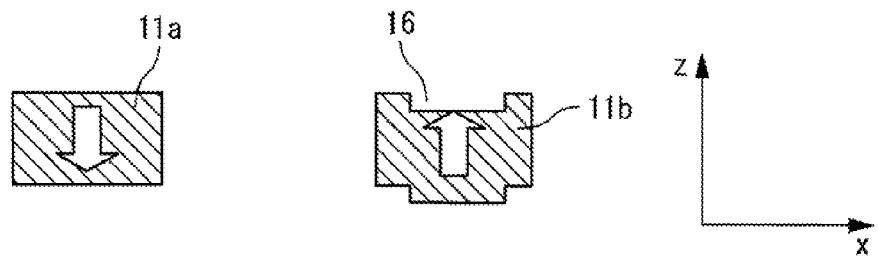
FIG. 3C is a cross-sectional view illustrating the configuration of the magnetoresistance element in FIG. 3A.

FIG. 3A is a plan view illustrating a structure of a magnetoresistance element 1 in a first embodiment, FIG. 3B is a cross-sectional view on the L1 cross section, and FIG. 3C is a cross-sectional view on the L2 cross section. As illustrated in FIG. 3A, the magnetoresistance element 1 is provided with a magnetization recording layer 10, a magnetization fixed layer 30, and a tunnel barrier layer 32 provided between them. The tunnel barrier layer 32 is a nonmagnetic dielectric layer, and formed of a thin dielectric film such as an $Al_2O_3$ film or a MgO film. The tunnel barrier layer 32 is sandwiched between the magnetization recording layer 10 and the magnetization fixed layer 30, and the magnetization recording layer 10, the tunnel barrier layer 32, and the magnetization fixed layer 30 form a magnetic tunnel junction (MTJ).

The magnetization recording layer 10 is a ferromagnetic layer having anisotropy in the direction perpendicular to the substrate surface (or perpendicular magnetic anisotropy). The magnetization recording layer 10 contains at least one material out of Fe, Co, and Ni. Further, the magnetization recording layer 10 may contain Pt or Pd to thereby stabilize the perpendicular magnetic anisotropy. In addition, doping of B, C, N, O, Al, Si, P, Ti, V, Cr, Mn, Cu, Zn, Zr, Nb, Mo, Tc, Ru, Rh, Ag, Hf, Ta, W, Re, Os, Ir, Au, or Sm into the magnetization recording layer 10 achieves adjustment so as to exhibit desired magnetic characteristics. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, or the like may be used as the material of the magnetization recording layer 10. Besides, a film stack in which a layer containing at least one material of Fe, Co, and Ni is laminated on a different layer may be used as the magnetization recording layer 10 that exhibits the perpendicular magnetic anisotropy. Specifically, a film stack of Co and Pd films, a film stack of Co and Pt films, a film stack of Co and Ni films, a film stack of Fe and Au films, or the like may be used as the magnetization recording layer 10.

The magnetization fixed layer 30 is formed of a ferromagnetic layer having a fixed magnetization, or a film stack of a ferromagnetic layer(s) and a nonmagnetic layer(s). The magnetization fixed layer 30 has a perpendicular magnetic anisotropy similarly to the magnetization recording layer 10. In addition, the magnetization fixed layer 30 is configured so that the direction of the magnetization thereof is not changed by write or read operations. For this purpose, the magnetization fixed layer 30 is configured to have magnetic anisotropy larger than that of the magnetization recording layer 10. This can be realized by appropriately selecting materials and compositions of the magnetization recording layer 10 and magnetization fixed layer 30. Also, the fixation of the magnetization direction of the magnetization fixed layer 30 may be realized by laminating an antiferromagnetic layer (not illustrated) on the surface of the magnetization fixed layer 30 opposite to the tunnel barrier layer to pin the magnetization. The magnetization fixed layer 30 may be formed of the same material(s) as that for the magnetization recording layer 10.

In this embodiment, as illustrated in FIG. 3B, the magnetization fixed layer 30 is formed of a film stack including a ferromagnetic layer 34, a nonmagnetic layer 31, and a ferromagnetic layer 33. The magnetization fixed layer 30 is configured such that the ferromagnetic layers 33 and 34 are antiferromagnetically coupled and the magnetization directions of the ferromagnetic layers 33 and 34 are directed in antiparallel to each other. The magnetizations of the two ferromagnetic layers 33 and 34 can be coupled antiparallel to each other, for example, by using a Ru or Cu film as the nonmagnetic layer 31, and appropriately selecting the thickness of the film. In this case, the leakage magnetic field from the magnetization fixed layer 30 can be suppressed by making the magnetizations of the two ferromagnetic layers 34 and 33 almost equal to each other.

Also, material exhibiting a large TMR effect, such as CoFe and CoFeB may be used in portions of the magnetization recording layer 10 and the magnetization fixed layer 30, in particular, in portions in contact with the tunnel barrier layer.

The magnetoresistance element 1 of this embodiment is configured to be adapted to write operations based on the domain wall motion. More specifically, the magnetization recording layer 10 of the magnetoresistance element 1 has a first magnetization fixed region 11a, a second magnetization fixed region 11b, and a magnetization reversal region 13. The magnetization reversal region 13 is formed so as to be opposed to the magnetization fixed layer 30. In other words, a portion of the magnetization reversal region 13 of the magnetization recording layer 10 is coupled to the magnetization fixed layer 30 across the tunnel barrier layer 32.

The magnetizations of the first and second magnetization fixed regions 11a and 11b are fixed in directions antiparallel to each other by an initialization operation which will be described later. It should be noted that the fact that "a magnetization is fixed" means that the direction of the magnetization is unchanged before and after a write operation. That is, even if the magnetization direction of a portion of the magnetization fixed region is changed in a write operation, the direction is restored after the write operation. On the other hand, the magnetization of the second magnetization fixed region 11b is reversed by an external magnetic field in the initialization operation as will be described later.

On the other hand, the direction of the magnetization of the magnetization reversal region 13 is reversible and directed in the +Z or −Z direction. That is, the magnetization of the magnetization reversal region 13 is allowed to be parallel or antiparallel to the magnetization of the first pinned magnetic layer 34. When the magnetization direction of the magnetization reversal region 13 is directed in the −Z direction, as illustrated in FIG. 3B, the magnetization reversal region 13 and first magnetization fixed region 11a form one magnetic domain, and the second magnetization fixed region 11b forms another magnetic domain. That is, a domain wall 12 is formed between the second magnetization fixed region 11b and the magnetization reversal region 13. When the magnetization direction of the magnetization reversal region 13 is the +Z direction, on the other hand, the magnetization reversal region 13 forms one magnetic domain, and the first magnetization fixed region 11a and the second magnetization fixed region 11b form another magnetic domain. That is, a domain wall is formed between the first magnetization fixed region 11a and the magnetization reversal region 13.

Figure 4:
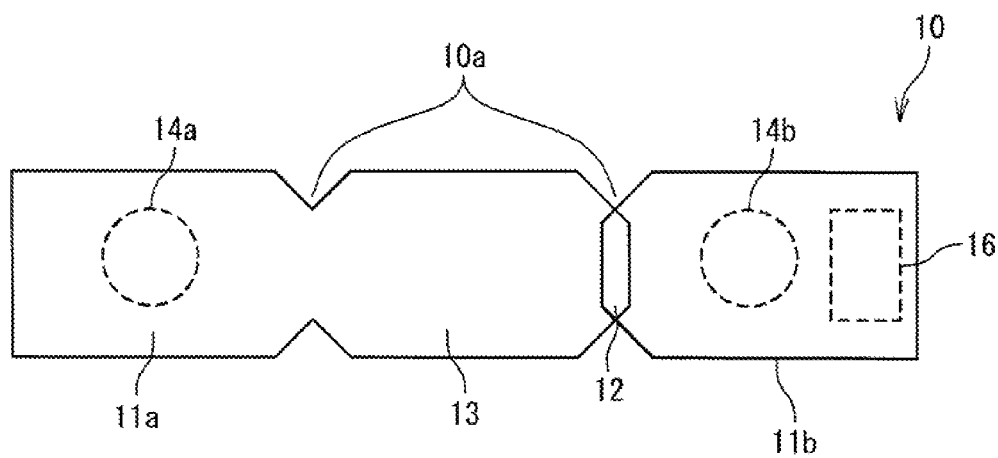
FIG. 4 is a plan view illustrating another configuration of the magnetoresistance element of the first embodiment.

The first and second magnetization fixed regions 11a and 11b respectively have wide shapes as compared with the magnetization reversal region 13. This is to form pinning potentials for the domain wall at the boundaries between the first and second magnetization fixed region 11a and 11b and the magnetization reversal region 13. Since the energy of the domain wall is almost proportional to the width of the magnetization recording layer 10, a domain wall generated in the first or second magnetization fixed region 11a or 11b easily moves to the magnetization reversal region 13, whereas a domain wall generated in the magnetization reversal region 13 is unlikely to move into the first or second magnetization fixed region 11a or 11b. Also, the domain wall is pinned at the boundary between the magnetization reversal region 13 and the first or second magnetization fixed region 11a or 11b by a static magnetic field from portions of the first and second magnetization fixed region 11a and 11b which protrude from the magnetization reversal region 13. As illustrated in FIG. 4, the pinning potentials may be formed by providing constriction portions 10a for the magnetization recording layer 10.

The first and second magnetization fixed regions 11a and 11b are respectively connected with current supply terminals 14a and 14b for applying a write current. The domain wall is introduced between the current supply terminals 14a and 14b by the initialization operation which will be described later, and driven by the write current. A portion on which the tunnel barrier layer 32 and the magnetization fixed layer 30 are laminated to constitute the MTJ should include a portion of the magnetization recording layer 10 between the current supply terminals 14a and 14b. This is because the magnetization direction between them is changed as a result of the write operation.

The current supply terminals 14a and 14b may be provided on any of the upper and lower sides of the magnetization recording layer 10, and may be formed by a via formation process, a top exposure process, or the like. The via formation process is typically performed in such a way that a metal layer is formed over the entire surface after via holes are formed through an interlayer dielectric film, and then the metal layer is processed to form via contacts by CMP (chemical mechanical polishing) or the like such that only portions of the metal layer inside the via holes remain. On the other hand, the top exposure process is performed in such a way that an insulating film serving as an interlayer dielectric film is formed after a connecting metal layer connected to the magnetization recording layer 10 is first patterned, and then the insulating film is polished by CMP or the like until the connecting metal layer is exposed. In the following, the current supply terminals are assumed to be formed by the via formation process, and referred to as via contacts instead of the current supply terminals.

The magnetoresistance element of this embodiment is configured so that the magnetoresistance element is provided with the magnetization recording layer 10 that is a ferromagnetic layer, wherein the magnetization recording layer 10 includes: the magnetization reversal region 13 having the reversible magnetization; the first magnetization fixed region 11a connected to a first boundary of the magnetization reversal region 13 and having the magnetization having the direction fixed in a first direction; and the second magnetization fixed region 11b connected to a second boundary of the magnetization reversal region and having the magnetization having the direction fixed in a second direction, and the magnetization reversal facilitation structure 16, which is a structure in which the magnetization is reversed more likely than the remaining portion, is formed in a portion of the second magnetization fixed region 11b. The magnetization of the magnetization reversal facilitation structure 16 is reversed before the magnetization of the remaining portion of the second magnetization fixed region 11b is reversed, when an external magnetic field is applied. When the magnetization in the magnetization reversal facilitation structure 16 is reversed, the magnetization reversal induces magnetization reversal in the remaining portion of the second magnetization fixed region 11b. This allows reversing the magnetization of the second magnetization fixed region 11b more easily than the magnetization of the first magnetization fixed region 11a. Such characteristics are useful in the initialization of the magnetization recording layer 10, as will be described later.

In this embodiment, a step structure is provided for the second magnetization fixed region 11b to function as the magnetization reversal facilitation structure 16 in any of the magnetoresistance elements 1 shown in FIGS. 3A to 3C and FIG. 4. Referring to FIG. 3C, the step structure is formed by forming a via contact 14a and a second via contact 14b, and then partially etching an interlayer film 19 having the same height as the upper surfaces of the vias to form a recess in a process before deposition of the magnetization recording layer 10. The magnetization recording layer 10 is formed into a shape with a portion depressed downward by an amount corresponding to the recess. The step structure of the second magnetization fixed region 11b facilitates magnetization reversal nucleation in the magnetization reversal of the second magnetization fixed region 11b. That is, the magnetization of the step portion of the second magnetization fixed region 11b is reversed by a small magnetic field.

As the magnetization reversal facilitation structure 16, other structures described below may be used. FIG. 5 is a perspective view illustrating another structure of the magnetization recording layer 10 in this embodiment. In FIG. 5, a portion 17 of the second magnetization fixed region 11b is thinned, and functions as the magnetization reversal facilitation structure 16. The structure shown in FIG. 5 may be obtained by etching the portion 17 after the deposition of the magnetization recoding layer 10. Since the magnetic characteristics of the etched portion 17 are deteriorated, the magnetization of the portion 17 is easily reversed. It should be noted that a clear step structure as illustrated in FIG. 5 is not necessarily formed by the etched portion 17; the same effect is produced even in a case where only micro concavities and convexities are formed on the surface. Also, a technique such as ion implantation and oxidation may be used instead of the etching.

FIG. 6 is a plan view illustrating still another structure of the magnetization recording layer 10 in this embodiment. In FIG. 6, intentional roughness 18 is provided at the boundary of the pattern of the second magnetization fixed region 11b to function as the magnetization reversal facilitation structure 16. The roughness 18 also facilitates the magnetization reversal nucleation, and therefore the magnetization of the second magnetization fixed region 11b is easily reversed.

It should be note that, in any of the cases shown in FIGS. 5 and 6, the magnetization reversal nucleation is facilitated in the second magnetization fixed region 11b, and the region where the magnetization is easily reversed is positioned out of a path through which the write current is applied. This aims at avoiding generation of the reversal nucleation by Joule heat, a current magnetic field, a spin torque effect, or the like caused by the current application, during the write operation.
(Initialization of Magnetization Fixed Region)

Next, an initialization process for the magnetoresistance element 1 of this embodiment, i.e., a domain wall introduction is described with reference to FIGS. 7A to 7D. In an example of FIGS. 7A to 7D, it is assumed that the region where the magnetization reversal nucleation easily occurs is formed by the step structure 16. It is also assumed that the coercive force of the magnetization fixed layer 30 is sufficiently larger than that of the magnetization recording layer 10, and the magnetization direction of the magnetization fixed layer 30 is unchanged in the initialization process, and illustration of the magnetization fixed layer 30 is omitted.

Figure 7A:
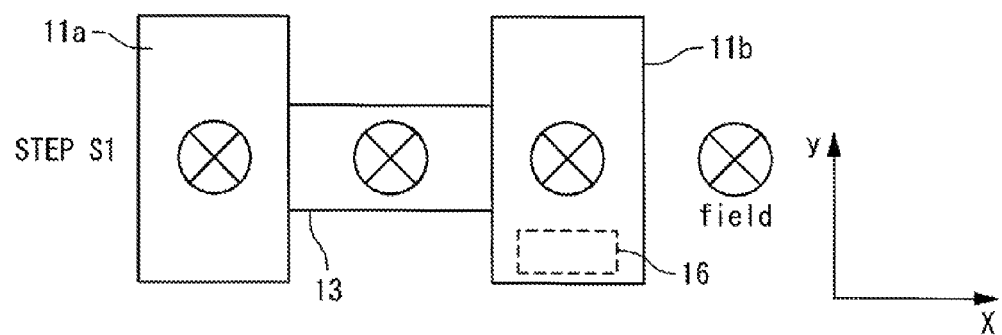
FIG. 7A is a plan view illustrating Step S1 of an initialization process for the magnetoresistance element of the first embodiment.
Figure 7B:
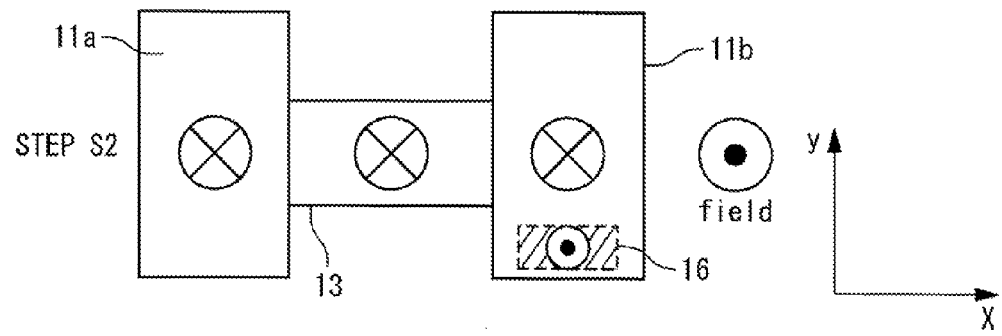
FIG. 7B is a plan view illustrating Step S2 of the initialization process for the magnetoresistance element of the first embodiment.
Figure 7C:
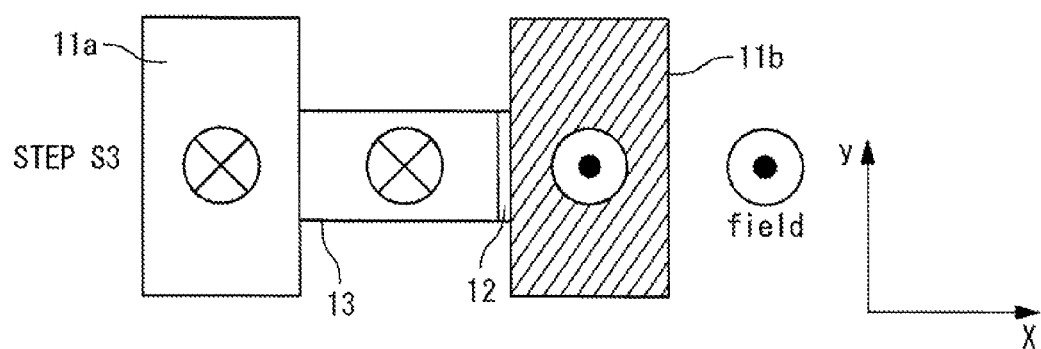
FIG. 7C is a plan view illustrating Step S3 of the initialization process for the magnetoresistance element of the first embodiment.
Figure 7D:
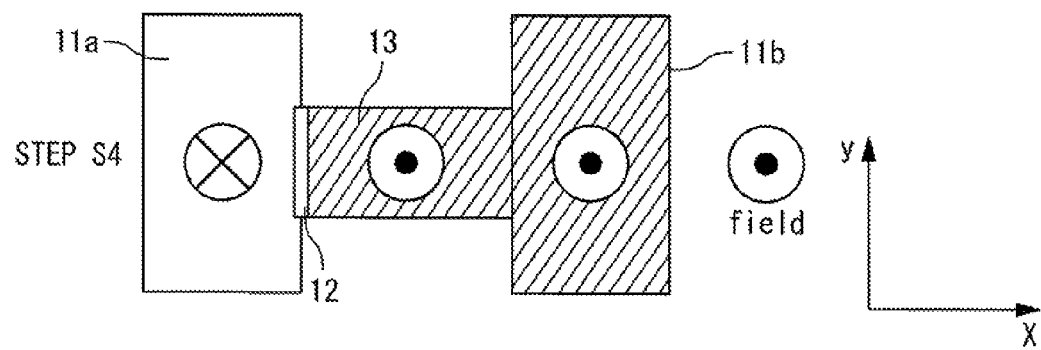
FIG. 7D is a plan view illustrating Step S4 of the initialization process for the magnetoresistance element of the first embodiment.

As illustrated in FIG. 7A, when a large magnetic field is first applied in the −Z direction, all magnetizations are directed in the −Z direction (Step S1). Then, as a magnetic field in the +Z direction is gradually increased, the magnetization in the region having the step structure 16 of the second magnetization fixed region is partially reversed as illustrated in FIG. 7B (Step S2). The reversal starts with the magnetization reversal nucleation in a very small region, and the magnetization reversal nucleus quickly propagates to reverse the magnetization in the entire region having the step structure 16. In this state, a domain wall is formed at the boundary between the step structure 16 region and the rest of the second magnetization fixed region 11b. When the magnetic field in the +Z direction is further increased, as illustrated in FIG. 7C, the domain wall is depinned from the boundary and propagates in the second magnetization fixed region 11b, resulting in that the domain wall is formed at the boundary between the magnetization reversal region 13 and the second magnetization fixed region 11b (Step S3). As illustrated in FIG. 7D, when the magnetic field in the +Z direction is further increased, the domain wall is depinned and propagates to the magnetization reversal region 13 and the magnetizations of the magnetization reversal region 13 and second magnetization fixed region 11b are reversed, resulting in that the domain wall is initialized at the boundary between the first magnetization fixed region 11a and the magnetization reversal region 13 (Step S4).

In order to introduce the domain wall and initialize the domain wall position in this manner, the applied magnetic fields should be appropriately adjusted depending on magnetic reversal characteristics of the magnetization recording layer. For the purpose of description, magnetic fields are defined as follows:

$H_{N\_STEP}$: the magnetic field causing the magnetization reversal nucleation in the step portion $H_N$: the magnetic field causing the magnetization reversal nucleation in a magnetization recording layer without a step structure $H_{P\_STEP}$: the propagation magnetic field of the domain wall in the step portion $H_P$: the propagation magnetic field of the domain wall in a magnetization recording layer without the step structure $H_{D\_STEP}$: the magnetic field depinning the domain wall from the step portion to a portion without a step structure $H_{D\_TO\_REV}$: the magnetic field depinning the domain wall from magnetization fixed region 11a or 11b to the magnetization reversal region 13

$H_{D\_TO\_PIN}$: the magnetic field depinning the domain wall from the magnetization reversal region 13 to the magnetization fixed region 11a or 11b It is also assumed that, as described above, the pinning potentials at the boundaries between the magnetization reversal region 13 and the magnetization fixed region 11a and 11b are formed to satisfy:

$$H_{D\_TO\_REV} < H_{D\_TO\_PIN}.$$

First, in order to cause the magnetization reversal nucleation in the step portion at the beginning, it is necessary to satisfy:

$$H_{N\_STEP} < H_N.$$

Then, since the magnetization reversal nucleation should be avoided in the region without the step in the initialization operation, it is necessary to satisfy:

$$H_N < H_{P\_STEP}, H_P, H_{D\_STEP}, H_{D\_TO\_REV}, H_{D\_TO\_PIN}.$$

Regarding the magnitudes of the magnetic field of the reversal nucleation in the step portion, the propagation magnetic field in the step portion, the magnetic field depinning from the step portion, and the propagation magnetic field in the portion without the step, any combination is possible in the present invention; the domain wall reaches the boundary between the magnetization reversal region 13 and the second magnetization fixed region 11b with the maximum magnetic field among them. The maximum magnetic field is defined as:

$$H_{MAX}=MAX(H_{N\_STEP}, H_{P\_STEP}, H_P, H_{D\_STEP}).$$

If the maximum magnetic field is larger than $H_{D\_TO\_PIN}$, the domain wall jumps Steps S3 and S4, and intrudes into the first magnetization fixed region 11a at once. Accordingly, it is necessary to satisfy:

$$H_{D\_TO\_PIN} > H_{MAX}.$$

When $H_{D\_TO\_REV} > H_{MAX}$, the domain wall can be pinned at the position of Step S3.

In summary, for initializing the domain wall with the initialization operation of Steps S1 to S3, it is necessary to satisfy:

$$H_N > H_{D\_TP\_REV} > H_{MAX},$$

and for initializing the domain wall with the initialization operation of Steps S1 to S4, it is necessary to satisfies:

$$H_N > H_{D\_TO\_PIN} > H_{MAX}.$$

In each case, the magnetic field at the time of the initialization operation is applied by sequentially applying two types of magnetic fields satisfying the following conditions:

$$H\_STEP1 < -H\_D\_TO\_PIN$$

$$H_{MAX} < H\_STEP3 < H_{D\_TO\_REV} \text{ or } H_{MAX} < H\_STEP4 < H_{D\_TO\_PIN}$$

It should be noted that, although three-step or four-step operation is illustrated in FIGS. 7A to 7D in order to facilitate the understanding of the principle, Steps S2 and S3, or Steps S2 to S4 may be simultaneously performed in the actual initialization process to achieve the initialization with the two-step magnetic field application.

It would be appreciated that a desired initial state can be obtained even if all the magnetic field directions are set to the opposite directions in the above-described initialization operation. Also, the magnetic field application direction is not necessary directed in the Z direction; the magnetic field application direction may have a certain degree of the X or Y component.

(Write Operation and Read Operation)

Next, a description is given of data writing onto the magnetoresistance element 1.

FIG. 8 illustrates the principle of data writing onto the structure illustrated in FIG. 3. The data writing is performed on the basis of the domain wall motion using the spin transfer. The write current flows in the in-plane direction of the magnetization recording layer 10, not in the direction passing through the MTJ. The write current is supplied from the via contact 14a or the second via contact 14b to the magnetization recording layer 10. The state in which the magnetization direction of the ferromagnetic layer 34 of the magnetization fixed layer 30 and the magnetization direction of the magnetization reversal region 13 are parallel to each other is associated with data "0". In the state of data "0", the magnetization direction of the magnetization reversal region 13 is directed in the −Z direction, and the domain wall 12 is present at the boundary between the magnetization reversal region 13 and the second magnetization fixed region 11b. On the other hand, the state in which the magnetization directions of the magnetization reversal region 13 and the ferromagnetic layer 34 are antiparallel to each other is associated with data "1". In the state of data "1", the magnetization direction of the magnetization reversal region 13 is directed in the +Z direction, and the domain wall 12 is present at the boundary between the magnetization reversal region 13 and the first magnetization fixed region 11a.

In writing data "1", the write current IW1 flows from the first magnetization fixed layer 11a to the second magnetization fixed layer 11b through the magnetization reversal region 13. In this case, spin electrons are injected into the magnetization reversal region 13 from the second magnetization fixed region 11b. The spins of the injected electrons drive the domain wall at the boundary between the magnetization reversal region 13 and the second magnetization fixer region 11b in the direction toward the first magnetization fixed region 11a. As a result, the magnetization direction of the magnetization reversal region 13 is switched to the +Z direction. That is, the magnetization of the magnetization reversal region 13 is reversed by the spin transfer effect, and the magnetization direction of the magnetization reversal region 13 is switched to the +Z direction.

In writing data "0", the write current IW2 flows from the second magnetization fixed layer 11b to the first magnetization fixed layer 11a through the magnetization reversal region 13. In this case, spin electrons are injected into the magnetization reversal region 13 from the first magnetization fixed region 11a. As a result, the magnetization of the magnetization reversal region 13 is reversed, and the magnetization direction of the magnetization reversal region 13 is switched to the −Z direction. As thus described, the magnetization direction of the magnetization reversal region 13 is switched by the write currents IW1 and IW2 flowing in the in-plane direction of the magnetization recording layer 10. The first and second magnetization fixed regions 11a and 11b respectively play roles as supply sources of electrons having different spins.

Also, data reading from the magnetoresistance element 1 is achieved in the following procedure: In data reading, a read current is supplied so as to flow between the magnetization fixed layer 30 and the magnetization reversal region 13. For example, the read current flows from one of the magnetization fixed regions 11a and 11b to the ferromagnetic layer 34 of the magnetization fixed layer 30 through the magnetization reversal region 13 and the tunnel barrier layer 32. Alternatively, the read current may flow from the ferromagnetic layer 34 of the magnetization fixed layer 30 to one of the magnetization fixed regions 11a and 11b through the tunnel barrier layer 32 and the magnetization reversal region 13. The resistance value of the magnetoresistance element is detected on the basis of the read current or read potential, to sense the magnetization direction of the magnetization reversal region 13.

Although a region where the magnetization reversal nucleation is likely to occur (in FIG. 8, the step structure 16) is formed in the second magnetization fixed region 11b in this embodiment, the magnetization of this region is not changed in the write or read process, since the write current or the read current does not pass through the region.

Second Embodiment

Figure 9B:
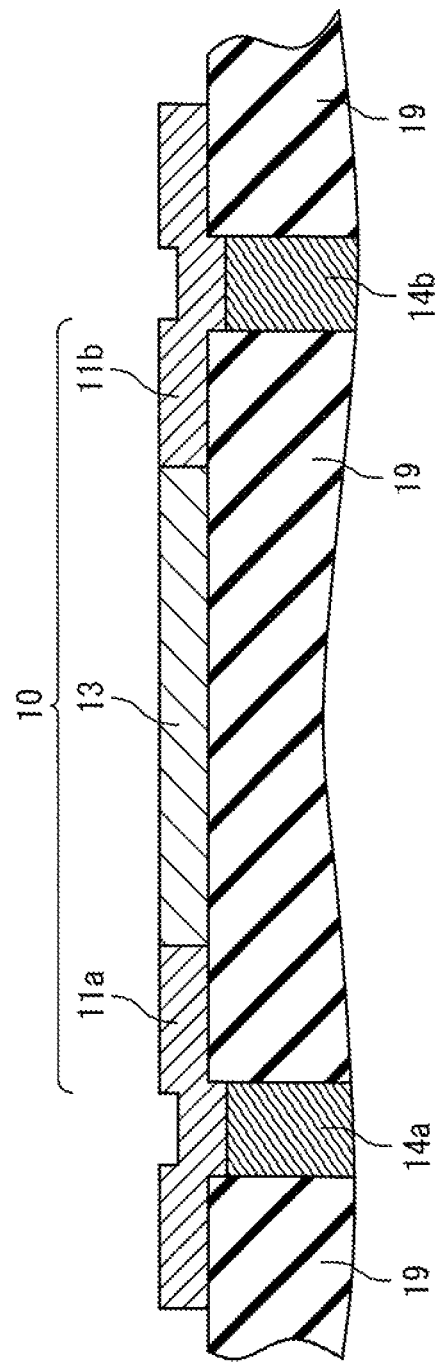
FIG. 9B is a cross-sectional view illustrating the configuration of the magnetoresistance element in FIG. 9A.

FIG. 9A is a plan view illustrating the structure of a magnetization recording layer 10 of a magnetoresistance element 1 in a second embodiment of the present invention, FIG. 9B is a cross-sectional view illustrating the structure on the L1 cross-section, and FIG. 9C is a cross-sectional view illustrating the structure on the L2 cross section. The magnetization recording layer 10 includes the first magnetization fixed region 11a, the second magnetization fixed region 11b, and the magnetization reversal region 13. As described above, the magnetization reversal region 13 refers to a region coupled to a tunnel barrier layer and a magnetization fixed layer (both not illustrated) constituting an MTJ.

In this embodiment, the via contact 14a, the second via contact 14b, and fourth via contacts 14c and 14d are coupled onto the lower surface of the magnetization recording layer 10. The via contacts 14a to 14d are formed in the same via formation process. The first magnetization fixed region 11a is connected with the via contact 14a, and the second magnetization fixed region 11b is connected with the second via contact 14b and fourth via contacts 14c and 14d. The via contact 14a (connected to the first magnetization fixed region 11a) and at least one of the second via contact 14b and fourth via contacts 14c and 14d (connected to the second magnetization fixed region 11b) are used as current supply terminals for supplying a write current to the magnetization reversal region 13.

In this embodiment, as illustrated in FIGS. 9B and 9C, the via contacts 14a to 14d are formed such that the upper surfaces thereof are positioned to be lower than the upper surface of an interlayer film 19; this allows forming step structures immediately above the via contacts 14a to 14d, when the first and second magnetization fixed regions 11a and 11b are formed. The formed step structures respectively function as structures that facilitate the magnetization reversal nucleation. Since the magnetization of the second magnetization fixed region 11b becomes more likely to be reversed by increasing the number of vias in the second magnetization fixed region 11b, the above-described initialization operation allows introduction of a domain wall and initialization of the domain wall position. In this embodiment, special processes for forming the step structures are not required, which leads to an advantage of process simplification. In the structure of FIGS. 9A to 9C, among the second via contact 14b and the fourth via contacts 14c and 14d, via contacts not used as the current supply terminal preferably have larger irregularity than the via contacts used as the current supply terminals.

It should be noted that, the magnetization reversal nucleation may occur also in the first magnetization fixed region 11a in the structure of FIGS. 9A to 9C. This is not preferable for performing the initialization with a high yield.

Figure 10B:
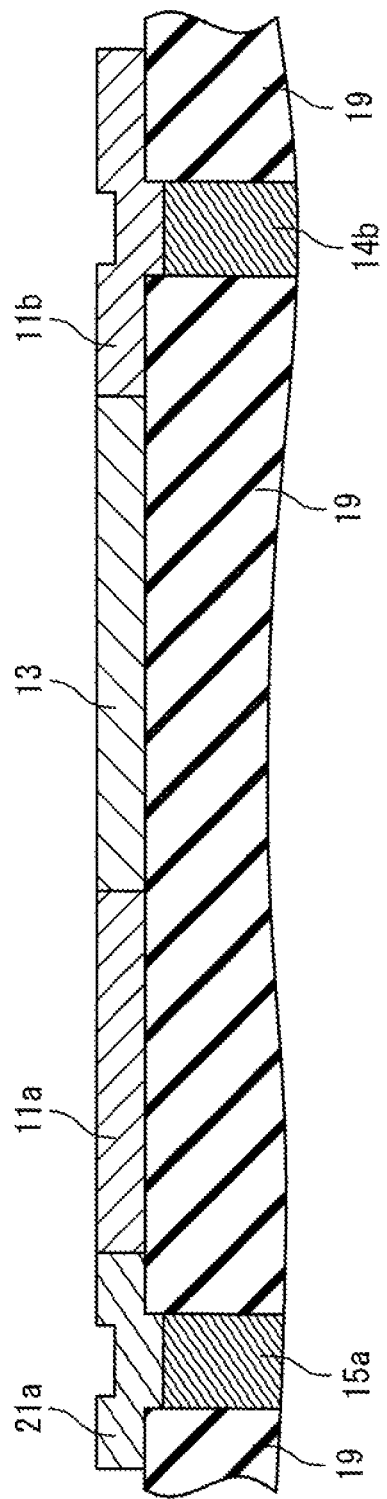
FIG. 10B is a cross-sectional view illustrating the configuration of the magnetoresistance element in FIG. 10A.

FIG. 10A is a plan view illustrating the magnetoresistance element 1 that is improved in this point. In this modification, provided in the magnetization recording layer 10 is a first magnetization assist region 21a outside of the first magnetization fixed region 11a, i.e., at the boundary opposite to the boundary in contact with the magnetization reversal region 13. The width of the first magnetization assist region 21a is narrower than that of the first magnetization fixed region 11a, and a pinning potential is formed at the boundary between them. When the width of the first magnetization assist region 21a is designed to be the same as that of the magnetization reversal region 13, for example, the magnetic field necessary to depin the domain wall at the pinning potential in the direction toward the first magnetization fixed region 11a is almost equal to the magnetic field necessary to depin the domain wall at the boundary between the magnetization reversal region 13 and the first magnetization fixed region 11a toward the another boundary of the first magnetization fixed region 11a. The first magnetization assist region 21a is connected with a first via contact 15a for supplying the write current. Another via contact for supplying the write current, i.e., the second via contact 14b is provided so as to be connected to the second magnetization fixed region 11b. The first and second via contacts 15a and 14b are formed by the same via formation process. As illustrated in FIG. 10B, the second via contact 14b is formed such that a step structure is intentionally formed in the second magnetization fixed region 11b, having a function to facilitate magnetization reversal nucleation. In this case, the second magnetization fixed region 11b may be provided with two or more via contacts.

Figure 11A:
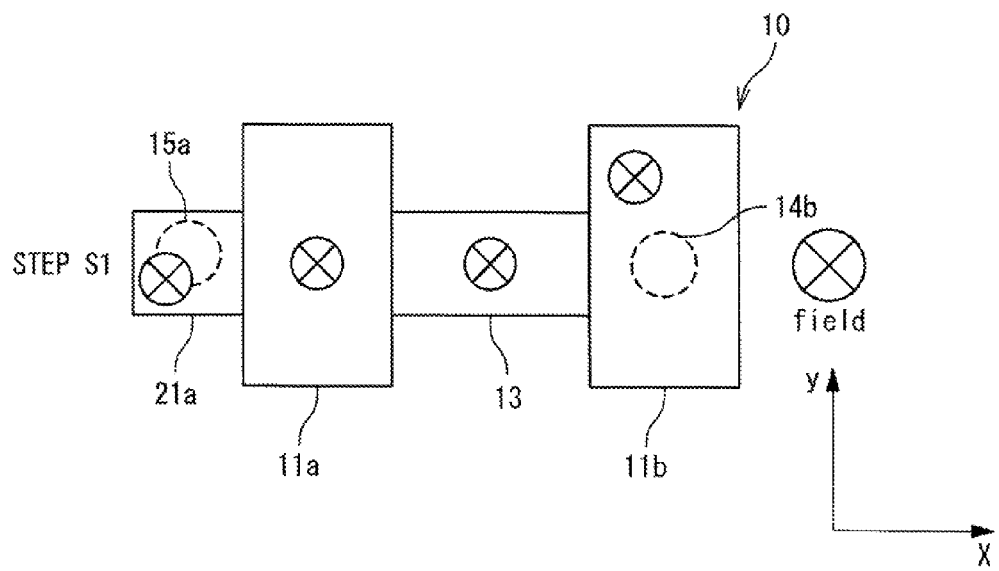
FIG. 11A is a plan view illustrating Step S1 of an initialization process for the magnetoresistance element illustrated in FIGS. 10A and 10B.
Figure 11B:
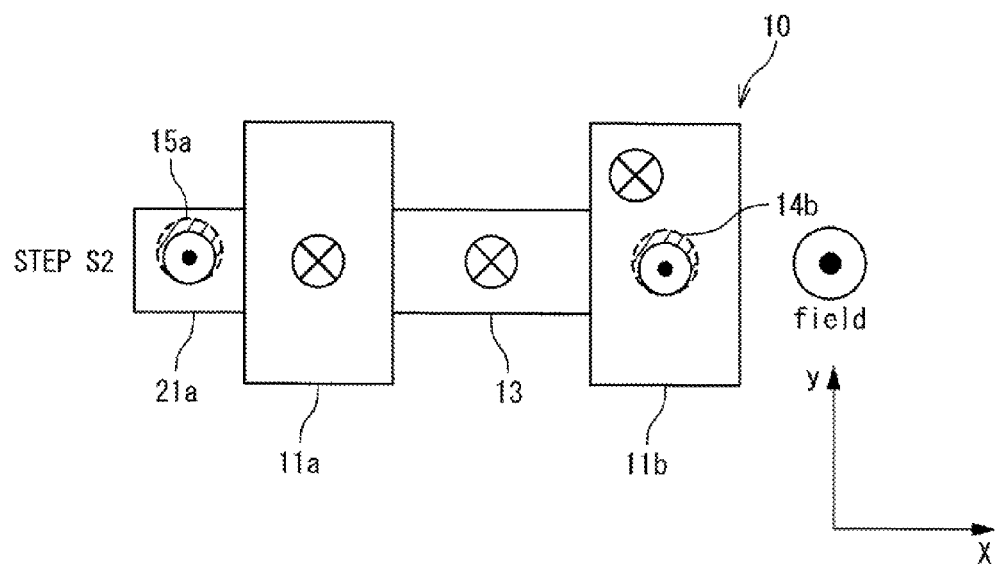
FIG. 11B is a plan view illustrating Step S2 of the initialization process for the magnetoresistance element illustrated in FIGS. 10A and 10B.
Figure 11C:
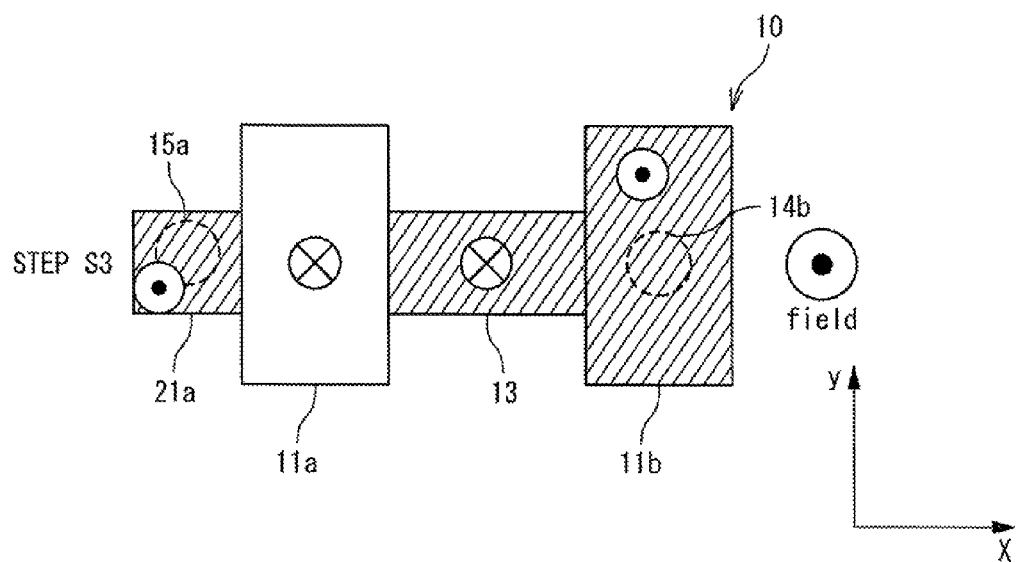
FIG. 11C is a plan view illustrating Step S3 of the initialization process for the magnetoresistance element illustrated in FIGS. 10A and 10B.
Figure 11D:
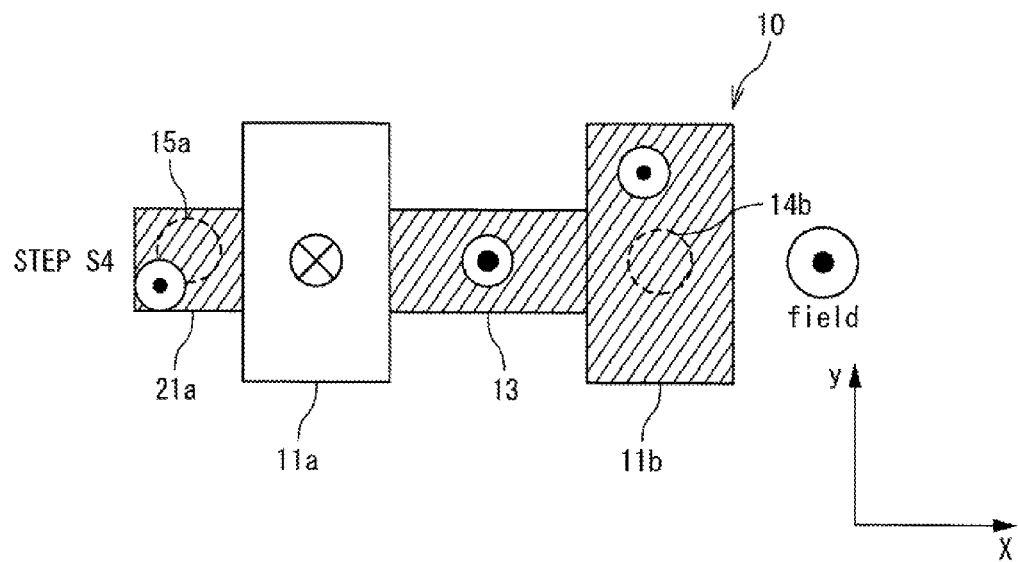
FIG. 11D is a plan view illustrating Step S4 of the initialization process for the magnetoresistance element illustrated in FIGS. 10A and 10B.

Next, a description is given of an initialization process in this embodiment, i.e., domain wall introduction with reference to FIGS. 11A to 11D. As illustrated in FIG. 11A, when a large magnetic field is first applied in the −Z direction, all the magnetizations are directed in the −Z direction (Step S1). Then, as illustrated in FIG. 11B, the magnetizations of regions immediately above the vias provided in the first magnetization assist region 21a and second magnetization fixed region 11b are partially reversed as the magnetic field in the +Z direction is gradually increased (Step S2). The reversals start with the magnetization reversal nucleation in very small regions and the magnetization reversal nuclei quickly propagate, resulting in that the magnetizations in the entire regions besides the vias are reversed. In this state, domain walls are formed at the boundaries between the regions besides the vias and the rest of the magnetization recording layer. As the magnetic field in the +Z direction is further increased, as illustrated in FIG. 11C, the domain walls are depinned from the boundaries and propagate into the first magnetization assist region 21a and second magnetization fixed region 11b, resulting in that the domain walls are formed at the boundaries between the first magnetization assist region 21a and the first magnetization fixed region and between the magnetization reversal region 13 and the second magnetization fixed region 11b, respectively (Step S3). As the magnetic field in the +Z direction is further increased, as illustrated in FIG. 11D, the domain wall formed at the boundary between the magnetization reversal region 13 and the second magnetization fixed region 11b is depinned to propagate into the magnetization reversal region 13, and the magnetizations of the magnetization reversal region 13 and second magnetization fixed region 11b are reversed, resulting in that the domain wall is initialized at the boundary between the first magnetization fixed region 11a and the magnetization reversal region 13 (Step S4). Similarly to the case of FIGS. 7A to 7D, it may be determined in consideration of the magnitude of the depinning magnetic field whether the domain wall initialization is completed in Step S3 or thoroughly performed by Step S4.

In the initialization operation of this embodiment, the domain wall is formed not only at the boundary between the magnetization reversal region 13 and the first or second magnetization fixed region 11a or 11b, but also at the boundary between the first magnetization assist region 21a and the first magnetization fixed region 11a. The latter domain wall is influenced by the spin transfer effect at the time of write operation. In order to keep the magnetization of the magnetization fixed region 13 unchanged, the design should be done such that the depinning toward the first magnetization fixed region 11a is avoided in the write operation by increasing the depinning threshold current from the first magnetization assist region 21a to the first magnetization fixed region 11a. On the other hand, the depinning toward the first magnetization assist region 21a does not influence the write or read operation in this embodiment, and is therefore not required to be limited. In addition, when the magnetic field depinning from the first magnetization fixed region 11a to the first magnetization assist region 21a is smaller than the magnetization reversal nucleation magnetic field in the via contact 14a, the domain wall may be depinned toward the first magnetization assist region 21a by applying the magnetic field in the −Z direction subsequently to Step S3 or Step S4, to initialize the magnetizations of the first magnetization fixed region 11a and first magnetization assist region 21 in the same direction.

As thus described, the configuration added with the first magnetization assist region 21a as illustrated in FIGS. 10A and 10B has an advantage of, as compared with the configuration illustrated in FIGS. 9A to 9C, being able to surely initialize the domain wall.

Figure 12:
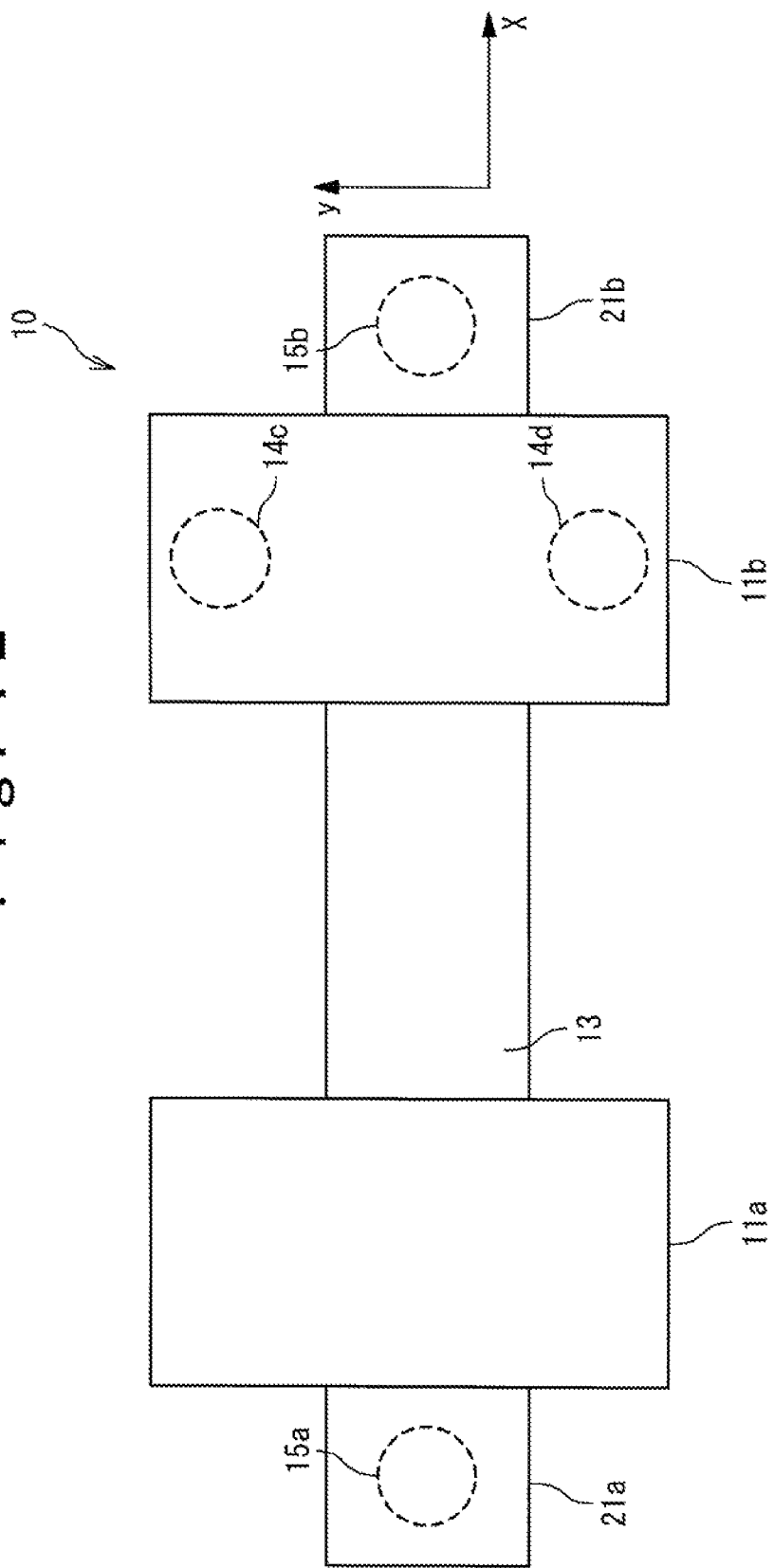
FIG. 12 is a plan view illustrating still another configuration of the magnetoresistance element of the second embodiment.

FIG. 12 is a plan view illustrating another configuration of the magnetoresistance element 1 for surely initializing the domain wall. In the configuration of FIG. 12, a second magnetization assist region 21b is provided outside of the second magnetization fixed region 11b, i.e., at the boundary opposite to the boundary in contact with the magnetization reversal region 13, in addition to the first magnetization assist region 21a. The width of the second magnetization assist region 21b is narrower than that of the second magnetization fixed region 11b, and a pinning potential is formed at the boundary between them. First and third via contacts 15a and 15b both for supplying the write current are provided so as to be respectively connected to the first magnetization assist region 21a and the second magnetization assist region 21b. Also, in the second magnetization fixed region 11b, one or more fourth via contacts 14c and 14d not connected to any current supply source are provided so as to bypass the path of the write current. These fourth via contacts 14c and 14d are formed such that step structures are intentionally formed in the second magnetization fixed region 11b, and thereby respectively have a function of facilitating the magnetization reversal nucleation.

Figure 13A:
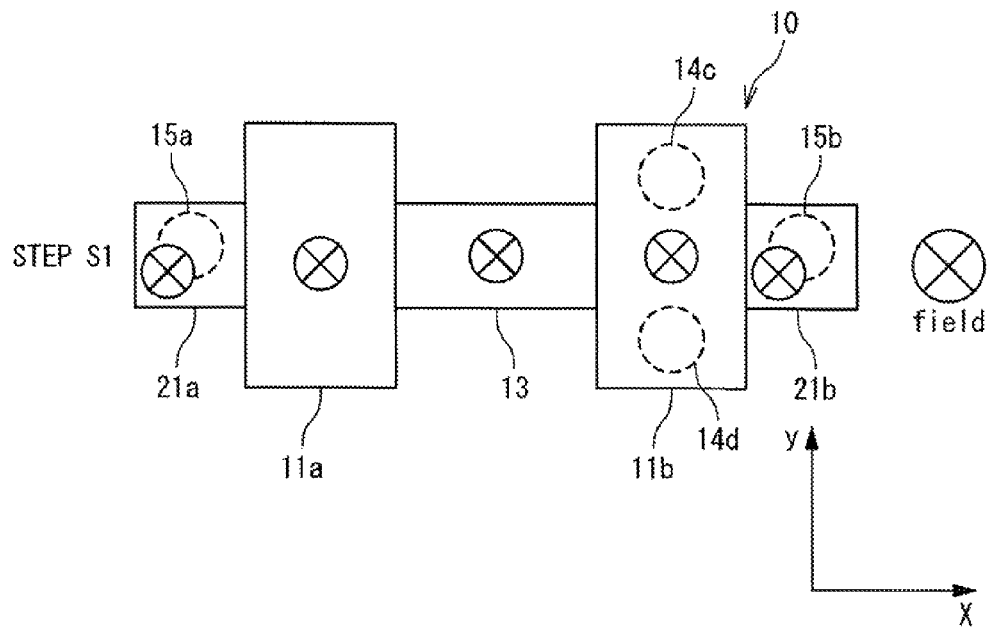
FIG. 13A is a plan view illustrating Step S1 of an initialization process for the magnetoresistance element illustrated in FIG. 12.
Figure 13B:
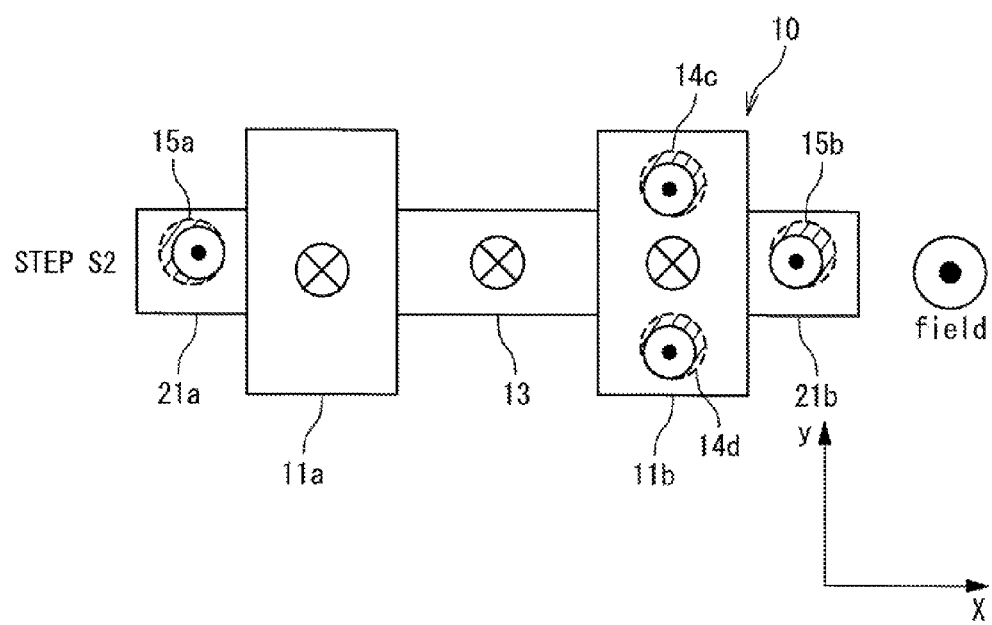
FIG. 13B is a plan view illustrating Step S2 of the initialization process for the magnetoresistance element illustrated in FIG. 12.
Figure 13C:
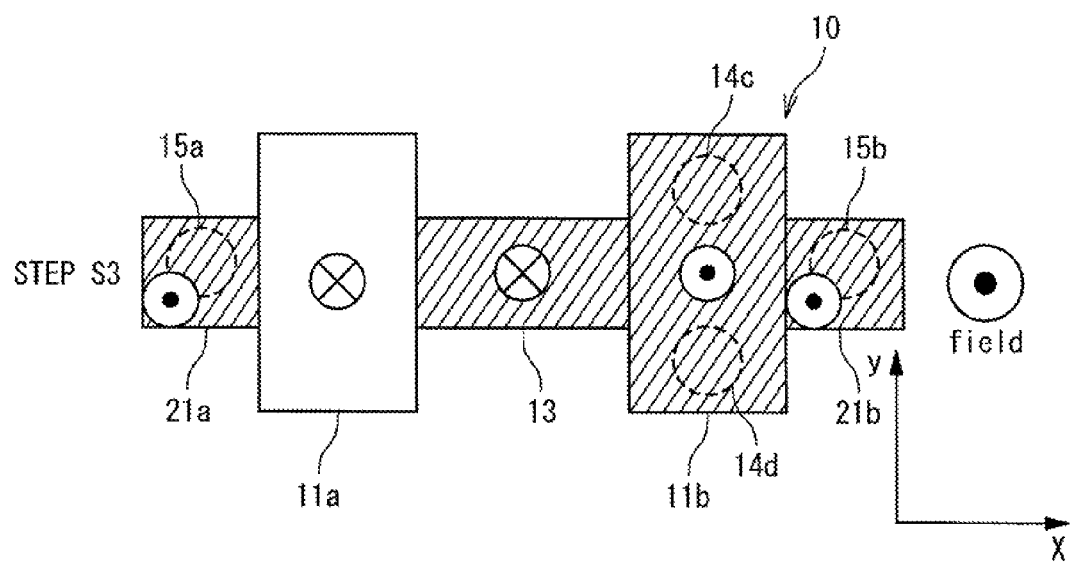
FIG. 13C is a plan view illustrating Step S3 of the initialization process for the magnetoresistance element illustrated in FIG. 12.
Figure 13D:
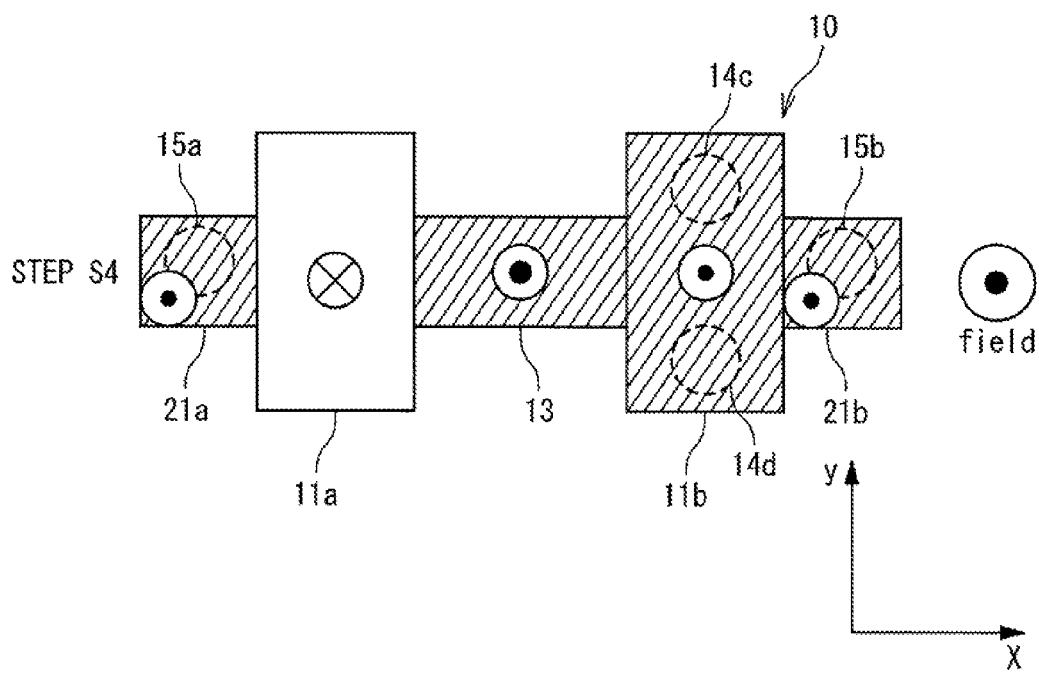
FIG. 13D is a plan view illustrating Step S4 of the initialization process for the magnetoresistance element illustrated in FIG. 12.

Next, a description is given of the initialization process of the magnetoresistance element 1 in FIG. 12, i.e., the domain wall introduction with reference to FIGS. 13A to 13D. As illustrated in FIG. 13A, when a large magnetic field is first applied in the −Z direction, all the magnetizations are directed in the −Z direction (Step S1). Then, as illustrated in FIG. 13B, the magnetizations in regions immediately above the first via contact 15a provided in the first magnetization assist region 21a, the third via contact 15b provided in the second magnetization assist region 21b, and the via contacts 14c and 14d provided in the second magnetization fixed region 11b are partially reversed as the magnetic field in the +Z direction is gradually increased (Step S2). These reversals start with the magnetization reversal nucleation in very small regions first and the magnetization reversal nuclei quickly propagate, resulting in that the magnetizations in the entire regions immediately above the fourth via contacts 14c and 14d, the first via contact 15a, and the third via contact 15b are reversed. In this state, domain walls are formed at boundaries between the regions corresponding to the via contacts 14c and 14d, the first via contact 15a, and the third via contact 15b, and the rest of the magnetization recording layer 10. As the magnetic field in the +Z direction is further increased, as illustrated in FIG. 13C, the domain walls are depinned from the boundaries and then propagate in the first magnetization assist region 21a, the second magnetization assist region 21b, and the second magnetization fixed region 11b, resulting in that the domain walls are formed at the boundaries between the first magnetization assist region 21a and the first magnetization fixed region 11a and between the magnetization reversal region 13 and the second magnetization fixed region 11b (Step S3). As the magnetic field in the +Z direction is further increased, as illustrated in FIG. 13D, the domain wall formed at the boundary between the magnetization reversal region 13 and the second magnetization fixed region 11b is depinned to propagate into the magnetization reversal region 13 and the magnetizations of the magnetization reversal region 13 and the second magnetization fixed region 11b are reversed, resulting in that the domain wall is initialized at the boundary between the first magnetization fixed region 11a and the magnetization reversal region 13 (Step S4). It may be determined in consideration of the magnitude of the depinning magnetic field whether the domain wall initialization is completed in Step S3 or thoroughly performed by Step S4, similarly to the case of FIGS. 7A to 7D.

Also in the initialization operation of this modification, similarly to the case of FIGS. 11A to 11D, the domain walls are created not only at the boundary between the magnetization reversal region 13 and the first or second magnetization fixed region 11a or 11b but also at the boundary between the first magnetization assist region 21a and the first magnetization fixed region 11a. The influence of the latter domain wall, however, can be dismissed as is the case of FIGS. 11A to 11D.

In the configuration of FIG. 12, the fourth via contacts 14c and 14d for causing the magnetization reversal nucleation in the second magnetization fixed region 11b are positioned off the write current path, whereas the first via contact 15a and third via contact 15b on the write current path are both positioned in the first and second magnetization assist regions 21a and 21b, respectively. This leads to an advantage that it is ensured that the magnetization reversals can be confined in the first and second magnetization assist regions 21a and 21b, and the magnetizations of the first and second magnetization fixed regions 11a and 11b are unchanged, even if the magnetization reversal nucleation or propagation occurs by the write current.

Third Embodiment

Figure 14A:
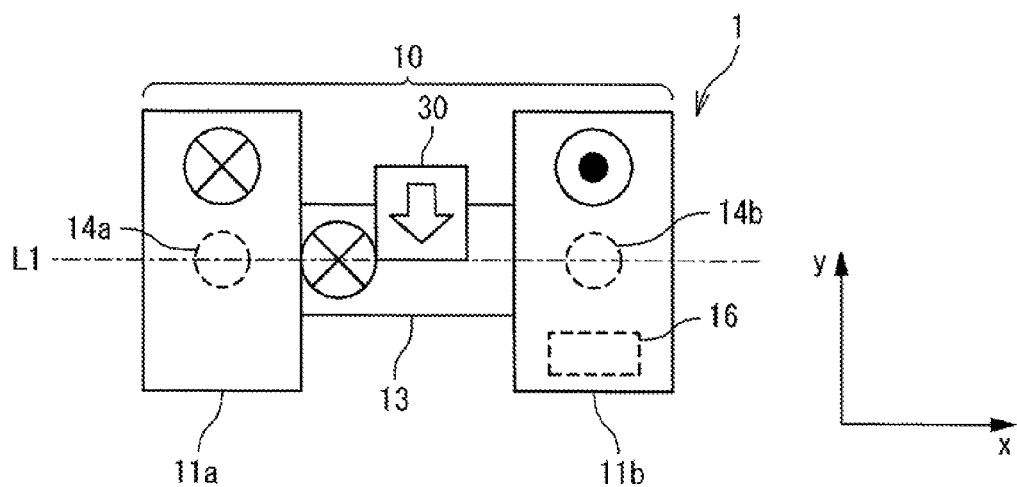
FIG. 14A is a plan view illustrating a configuration of a magnetoresistance element in a third embodiment of the present invention.
Figure 14B:
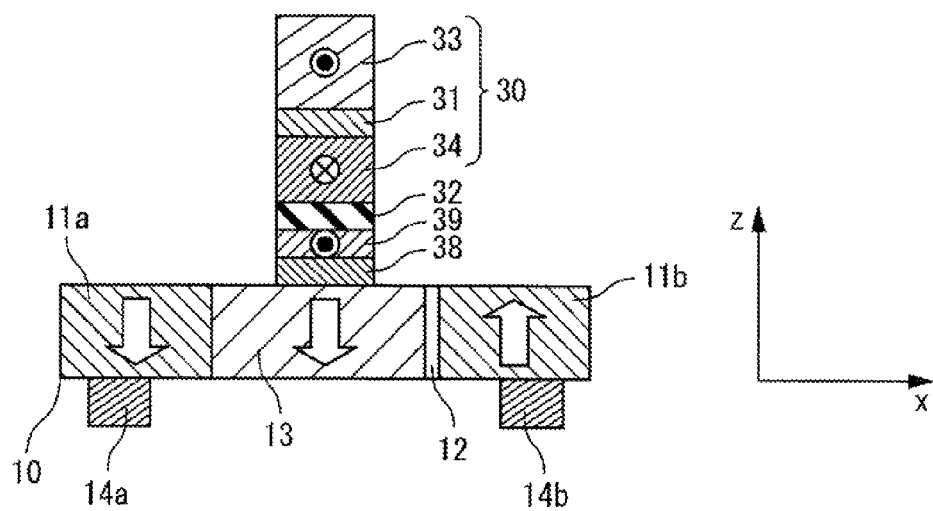
FIG. 14B is a cross-sectional view illustrating the configuration of the magnetoresistance element in FIG. 14A.

FIG. 14A is a plan view illustrating a configuration of a magnetoresistance element 1 in a third embodiment of the present invention, and FIG. 14B is a cross-sectional view. In the third embodiment, a separating metal layer 38 and a sensing magnetic layer 39 are provided between a tunnel barrier layer 32 and the magnetization recording layer 10, and a film stack including the separating metal layer 38, the sensing magnetic layer 39, the tunnel barrier layer 32, and the magnetization fixed layer 30 is arranged at a position that is offset from the center of the magnetization recording layer 10 in the Y direction. Specifically, the sensing magnetic layer 39 is provided so that a portion thereof is opposed to the magnetization reversal region 13, and the tunnel barrier layer 32 is provided on the sensing magnetic layer 39. The magnetization fixed layer 30 is provided on the tunnel barrier layer 32 so as to be opposed to the sensing magnetic layer 39.

In the third embodiment, magnetic material having in-plane magnetic anisotropy is used for both of the sensing magnetic layer 39 and the magnetization fixed layer 30. That is, the magnetization fixed layer 30, the tunnel barrier layer 32, and the sensing magnetic layer 39 form an in-plane MTJ. In such a configuration, a leakage magnetic field from the magnetization recording layer 10 rotates the magnetization of the sensing magnetic layer 39, and thereby the magnetization direction of the magnetization recording layer 10 can be indirectly read by the in-plane MTJ including the sensing magnetic layer 39, the tunnel barrier layer 32, and the magnetization fixed layer 30. The initialization method, the writing method, and the reading method in this embodiment are the same as those illustrated in FIGS. 7 and 8. It should be also noted that the reading configuration presented in this embodiment is applicable to both of the first and second embodiments. Further, the tunnel barrier layer 32 and the magnetization fixed layer 30 may be provided on the lower side of the magnetization recording layer 10.

Integration within MRAM

Figure 15:
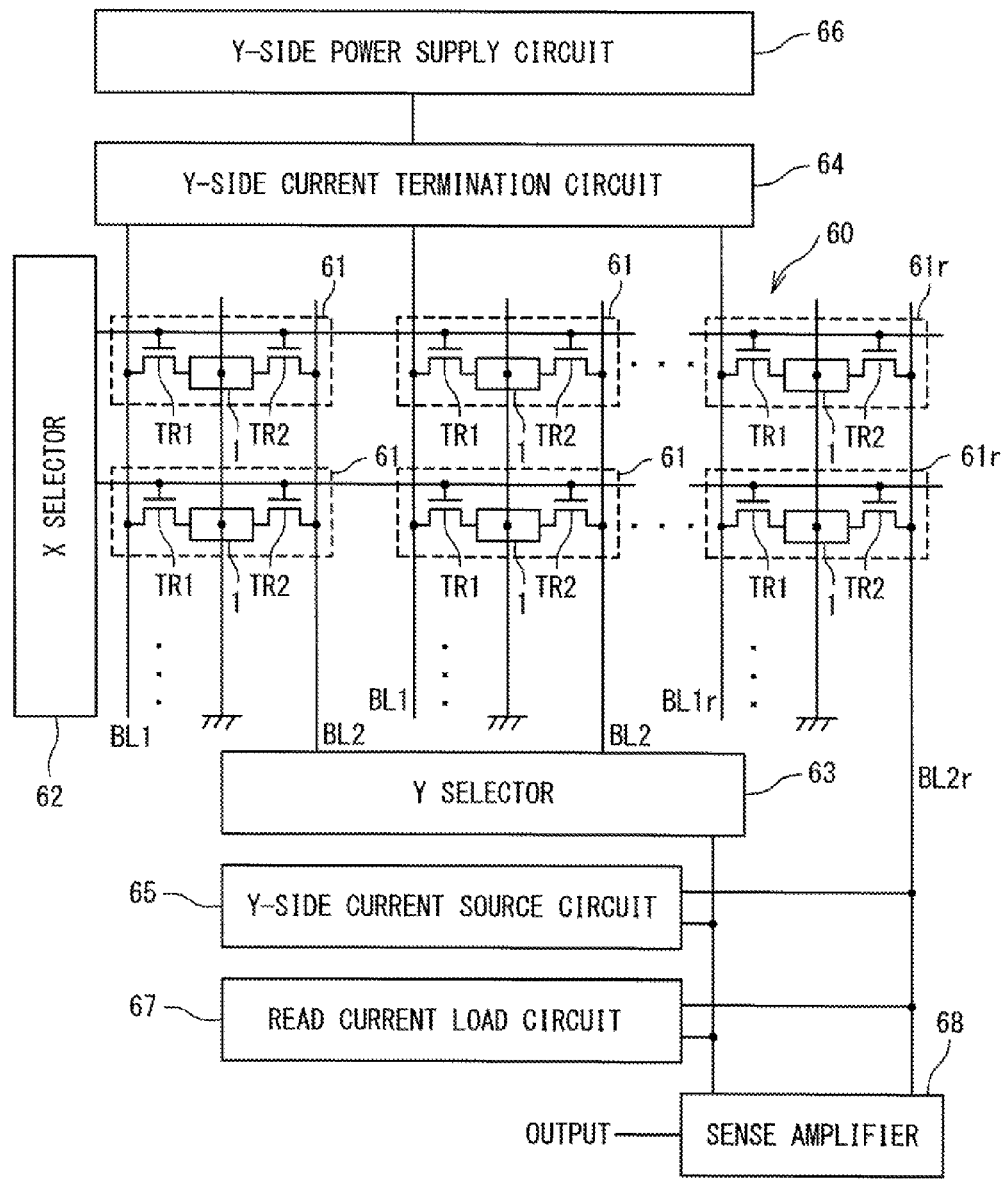
FIG. 15 is a conceptual diagram illustrating a configuration of an MRAM in one embodiment of the present invention.

The magnetoresistance element 1 of the first to third embodiment may be integrated and used within an MRAM. FIG. 15 is a conceptual diagram illustrating the configuration of such an MRAM. The MRAM has a memory cell array 60 in which a plurality of memory cells 61 are arranged in a matrix. Integrated in each of the memory cells 61 are a magnetoresistance element 1 and two selection transistors TR1 and TR2. One of the source and drain of the selection transistor TR1 is connected to the via contact 14a connected to the first magnetization fixed region 11a (or the first magnetization assist region 21a), and the other is connected to a first bit line BL1. One of the source and drain of the selection transistor TR2 is connected to the second via contact 14b of the second magnetization fixed region 11b for the second magnetization assist region 21b), and the other is connected to a second bit line BL2. The gates of the selection transistors TR1 and TR2 are connected to a word line WL. The magnetization fixed layer 30 of the magnetoresistance element 1 is connected to a ground line through an interconnection.

The word lines WL are connected to an X selector 62. In data writing or reading, the X selector 62 selects a word line WL corresponding to a target memory cell 61 (hereinafter referred to a selected memory cell) as a selected word line. The first bit lines BL1 are connected to a Y-side current termination circuit 64, and the second bit lines BL2 are connected to a Y selector 63. The Y selector 63 selects the second bit line BL2 connected to the selected memory cell as a selected second bit line. The Y-side current termination circuit 64 selects the first bit line BL1 connected to the selected memory cell as a selected first bit line.

The memory cell array 60 includes reference cells 61r that are referenced in data reading in addition to the memory cells 61 used for data recording. The structure of the reference cells 61r is same as that of the memory cells 61. A first reference bit line BL1r and a second reference bit line BL2r are provided along the column of the reference cells 61r.

The operation of the MRAM in data writing is as follows: A Y-side current source circuit 65 supplies or draws a predetermined write current (IW1 or IW2) to or from the selected second bit line. A Y-side power supply circuit 66 supplies a predetermined voltage to the Y-side current termination circuit 64 in the data writing. As a result, the write current (IW1 or IW2) flows into or out of the Y selector 63. The X selector 62, the Y selector 63, the Y side current termination circuit 64, the Y side current source circuit 65, and the Y side power supply circuit 66 constitute a write current supply circuit for supplying the write current IW1 or IW2 to the magnetoresistance element 1.

On the other hand, the operation of the MRAM in data reading is as follows: The first bit line BL1 is set to "Open". A read current load circuit 67 flows a predetermined read current through the selected second bit line. Also, the read current load circuit 67 flows a predetermined current through the second reference bit line BL2r connected to the reference cell 61r corresponding to the selected word line. A sense amplifier 68 identifies data stored in the selected memory cell from the difference in potential between the second reference bit line BL2r and the selected second bit line, and outputs the identified data.

Although various embodiments of the present invention are described above, the present invention is not limited to any of the above-described embodiments. Various modifications that the person skilled in the art would understand within the scope of the present invention may be made to the configuration and details of the present invention.

This application is the National Phase of PCT/JP2009/067890, filed Oct. 16, 2009, which is based on Japanese patent application No. 2008-270002, filed on Oct. 20, 2008, and claims priority based on the application, the entire disclosure of which is incorporated herein by reference.

The invention claimed is:

1. A magnetoresistance element, comprising:
   a magnetization recording layer which is a ferromagnetic layer,
   wherein said magnetization recording layer includes:
   a magnetization reversal region having a reversible magnetization;
   a first magnetization fixed region connected to a first boundary of said magnetization reversal region and having a fixed magnetization directed in a first direction,
   a second magnetization fixed region connected to a second boundary of said magnetization reversal region and having a fixed magnetization directed in a second direction, and
   wherein at least one magnetization reversal facilitation structure is provided for a portion of said second magnetization fixed region, said magnetization reversal facilitation structure being a structure in which a magnetization is reversed more easily than in a remaining portion of said second magnetization fixed region.

2. The magnetoresistance element according to claim 1, wherein said magnetization reversal facilitation structure is a step structure provided for said second magnetization fixed region.

3. The magnetoresistance element according to claim 2, further comprising:
   an interlayer dielectric; and
   a first via contact,
   wherein said magnetization recording layer is formed on said interlayer dielectric,
   wherein said first via contact is connected to said second magnetization fixed region through said interlayer dielectric,
   wherein a top surface of said first via contact is positioned lower than a top surface of said interlayer dielectric, and
   wherein said step structure is formed immediately above said first via contact.

4. The magnetoresistance element according to claim 3, wherein said magnetization recording layer further includes a first magnetization assist region provided in contact with said first magnetization fixed region and having a pin potential at a boundary with said first magnetization fixed region,
   wherein said magnetoresistance element further comprises a second via contact formed in a same via formation process as said first via contact and connected to said first magnetization assist region through said interlayer dielectric, and
   wherein a write current supplied to said magnetization recording layer is supplied to said magnetization recording layer through said second via contact.

5. The magnetoresistance element according to claim 4, wherein a width of said first magnetization assist region is narrower than that of said first magnetization fixed region at the boundary between said first magnetization fixed region and said first magnetization assist region.

6. The magnetoresistance element according to claim 4, wherein the write current supplied to said magnetization recording layer is supplied to said magnetization recording layer through said first via contact.

7. The magnetoresistance element according to claim 3, wherein said magnetization recording layer further includes a second magnetization assist region provided in contact with said second magnetization fixed region and having a pin potential at a boundary with said second magnetization fixed region,
wherein said magnetoresistance element further comprises a third via contact formed in the same via formation process as said first via contact and connected to said second magnetization assist region through said interlayer dielectric, and
wherein a write current supplied to said magnetization recording layer is supplied to said magnetization recording layer through said third via contact.

8. The magnetoresistance element according to claim 7, wherein a width of said second magnetization assist region is narrower than that of said second magnetization fixed region at the boundary between said second magnetization fixed region and said second magnetization assist region.

9. The magnetoresistance element according to claim 3, wherein said at least one magnetization reversal facilitation structure includes a plurality of magnetization reversal facilitation structures provided for the portion of said second magnetization fixed region, each of said plurality of magnetization reversal facilitation structures being a structure in which a magnetization is reversed more easily than in the remaining portion, and
wherein one(s) of said plurality of magnetization reversal facilitation structures other than said step structure is formed out of a path of a write current.

10. The magnetoresistance element according to claim 9, wherein the one(s) of said plurality of magnetization reversal facilitation structures other than said at least one magnetization reversal facilitation structure includes a fourth via contact formed in a same process as said first via contact.

11. The magnetoresistance element according to claim 9, wherein the one(s) of said plurality of magnetization reversal facilitation structures other than said step structure has larger irregularity than said step structure.

12. The magnetoresistance element according to claim 1, wherein said magnetization reversal facilitation structure is roughness of an end face of said second magnetization fixed region.

13. The magnetoresistance element according to claim 1,
wherein a width of said magnetization reversal region is narrower than that of said first magnetization fixed region at the first boundary between said magnetization reversal region and said first magnetization fixed region, and
wherein the width of said magnetization reversal region is narrower than that of said second magnetization fixed region at the second boundary between said magnetization reversal region and said second magnetization fixed region.

14. The magnetoresistance element according to claim 1, further comprising:
a magnetization fixed layer formed to be opposed to said magnetization reversal region; and
a tunnel barrier layer formed between said magnetization fixed layer and said magnetization reversal region,
wherein both of said magnetization recording layer and said magnetization fixed layer have perpendicular magnetic anisotropy.

15. The magnetoresistance element according to claim 1, further comprising:
a sensing magnetic layer at least partially opposed to said magnetization reversal region in one of said first and second directions;
a tunnel barrier layer provided on said sensing magnetic layer; and
a magnetization fixed layer provided on said tunnel barrier layer,
wherein said magnetization recording layer has perpendicular magnetic anisotropy, and
wherein said sensing magnetic layer and said magnetization fixed layer has in-plane magnetic anisotropy.

16. An MRAM, comprising:
a plurality of memory cells each including a magnetoresistance element,
wherein said magnetoresistance element comprises:
a magnetization recording layer which is a ferromagnetic layer,
wherein said magnetization recording layer includes:
a magnetization reversal region having a reversible magnetization;
a first magnetization fixed region connected to a first boundary of said magnetization reversal region and having a fixed magnetization directed in a first direction,
a second magnetization fixed region connected to a second boundary of said magnetization reversal region and having a fixed magnetization directed in a second direction, and
wherein at least one magnetization reversal facilitation structure is provided for a portion of said second magnetization fixed region, said magnetization reversal facilitation structure being a structure in which a magnetization is reversed more easily than in a remaining portion of said second magnetization fixed region.

17. An initialization method of a magnetoresistance element including a magnetization recording layer which is a ferromagnetic layer, the magnetization recording layer comprising: a magnetization reversal region having a reversible magnetization; a first magnetization fixed region connected to a first boundary of said magnetization reversal region and having a fixed magnetization directed in a first direction, a second magnetization fixed region connected to a second boundary of said magnetization reversal region and having a fixed magnetization directed in a second direction, and said method comprising:
a step of applying a first magnetic field to said magnetization recording layer, the first magnetic field being larger than a magnetic field depinning a domain wall positioned at said first boundary into said first magnetization fixed region and larger than a magnetic field depinning a domain wall positioned at said second boundary into said second magnetization fixed region; and
a step of applying a second magnetic field in an direction opposite to said first magnetic field, the second magnetic field being larger than a magnetization reversal nucleation magnetic field, a propagation magnetic field, and a depin field in a magnetization reversal facilitation structure provided for a portion of said second magnetization fixed region, and larger than a propagation magnetic field in said second magnetization fixed region, the magnetization reversal facilitation structure being a structure in which a magnetization is reversed more easily than in a remaining portion.

18. The initialization method according to claim 17, wherein said second magnetization field is smaller than a magnetic field for depinning the domain wall positioned at said first boundary into said first magnetization fixed region and smaller than a magnetic field for depinning the domain wall positioned at said second boundary into said second magnetization fixed region.

19. The initialization method according to claim 18, wherein said second magnetization field is smaller than a magnetic field for depinning the domain wall positioned at said first boundary into said magnetization reversal region and smaller than a magnetic field for depinning the domain wall positioned at said second boundary into said magnetization reversal region.

* * * * *